US012588574B2

(12) United States Patent
Yang et al.

(10) Patent No.: US 12,588,574 B2
(45) Date of Patent: Mar. 24, 2026

(54) COMPENSATION METHOD FOR WAFER BONDING

(71) Applicant: MACRONIX INTERNATIONAL CO., LTD., Hsinchu (TW)

(72) Inventors: Tien Chu Yang, Hsinchu City (TW); Chin Cheng Yang, Kaohsiung County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 386 days.

(21) Appl. No.: 18/190,206

(22) Filed: Mar. 27, 2023

(65) Prior Publication Data

US 2024/0332246 A1     Oct. 3, 2024

(51) Int. Cl.
| | |
|---|---|
| *H01L 23/00* | (2006.01) |
| *H10W 72/00* | (2026.01) |
| *H10W 99/00* | (2026.01) |
| *H10P 72/00* | (2026.01) |
| *H10W 80/00* | (2026.01) |

(52) U.S. Cl.
CPC ......... *H10W 99/00* (2026.01); *H10W 72/019* (2026.01); *H10W 72/071* (2026.01); *H10P 72/0616* (2026.01); *H10W 80/163* (2026.01); *H10W 80/312* (2026.01)

(58) Field of Classification Search
CPC .... H01L 24/80; H01L 24/98; H01L 21/67288
See application file for complete search history.

(56) References Cited

U.S. PATENT DOCUMENTS

| | | | | |
|---|---|---|---|---|
| 5,268,973 | A * | 12/1993 | Jenevein ................. | G02B 6/43 |
| | | | | 398/164 |
| 10,529,694 | B2 | 1/2020 | Guo | |
| 2009/0117710 | A1* | 5/2009 | Kim ....................... | H01L 21/78 |
| | | | | 257/E21.532 |
| 2021/0028009 | A1* | 1/2021 | Liang ................ | H01L 21/02046 |
| 2023/0154805 | A1 | 5/2023 | Feng et al. | |

FOREIGN PATENT DOCUMENTS

| | | |
|---|---|---|
| CN | 109451763 A | 3/2019 |
| WO | 2022057007 A1 | 3/2022 |

* cited by examiner

*Primary Examiner* — Dale E Page
*Assistant Examiner* — Wilner Jean Baptiste
(74) *Attorney, Agent, or Firm* — McClure, Qualey & Rodack, LLP

(57) ABSTRACT

A compensation method for wafer bonding includes bonding a first wafer and a second wafer, the first wafer including a first conductive pad and a second conductive pad. A first overlay check is performed. A result of the first overlay check is determined whether the result is within a first predetermined specification. If the result of the first overlay check is determined as beyond the first predetermined specification, performing a first compensation method to form a compensated first wafer and a compensated second wafer, wherein a position of a first conductive pad of the compensated first wafer is different from a position of the first conductive pad of the first wafer, and a position of a second conductive pad of the compensated first wafer is different from a position of the second conductive pad of the first wafer.

6 Claims, 18 Drawing Sheets

M1

COMPENSATION METHOD FOR WAFER BONDING

BACKGROUND

Field of Invention

The present invention relates to a compensation method for wafer bonding.

Description of Related Art

Following the development of semiconductor industry, wafer level packaging (WLP) process has been continuously progressed. To increase the device density, three dimensional integrated circuits (3DICs) are developed where two chips (or integrated circuits) are bonded together to create electrical connection between the two chips. However, such new type of bonding technics may experience difficulties of manufacturing, such as wafer warpage, which may result in overlay error during the manufacturing process. Accordingly, a compensation method is needed to solve the above issue.

SUMMARY

In some embodiments of the present disclosure, a compensation method for wafer bonding includes bonding a first wafer and a second wafer, in which the first wafer has a first conductive pad and a second conductive pad, and the second wafer has a third conductive pad and a fourth conductive pad; performing a first overlay check to the first wafer and the second wafer, the first overlay check including determining whether the first conductive pad is in contact with the third conductive pad and determining whether the second conductive pad is in contact with the fourth conductive pad; determining whether a result of the first overlay check is within a first predetermined specification; if the result of the first overlay check is determined as beyond the first predetermined specification, performing a first compensation method to produce a compensated first wafer and a compensated second wafer, the first compensation method including defining a position of a first conductive pad of the compensated first wafer and a position of a second conductive pad of the compensated first wafer, and defining a position of a third conductive pad of the compensated second wafer and a position of a fourth conductive pad of the compensated second wafer, in which the position of the first conductive pad of the compensated first wafer is different from a position of the first conductive pad of the first wafer, and the position of the second conductive pad of the compensated first wafer is different from a position of the second conductive pad of the first wafer; and bonding the compensated first wafer and the compensated second wafer.

In some embodiments, the result of the first overlay check is determined as beyond the first predetermined specification when a contact area between the first conductive pad of the first wafer and the third conductive pad of the second wafer is less than a first predetermined value or a contact area between the second conductive pad of the first wafer and the fourth conductive pad of the second wafer is less than a second predetermined value.

In some embodiments, the method further includes prior to performing the first compensation method, performing a second compensation method, the second compensation method including separating the first wafer and the second wafer; adjusting relative positions of the first wafer and the second wafer; and re-bonding the first wafer and the second wafer; performing a second overlay check, the second overlay check including determining whether the first conductive pad of the first wafer is in contact with the third conductive pad of the second wafer and determining whether the second conductive pad of the first wafer is in contact with the fourth conductive pad of the second wafer; and determining whether a result of the second overlay check is within a second predetermined specification, in which the first compensation method is performed in response to the result of the second overlay check is determined as beyond the second predetermined specification.

In some embodiments, the method further includes after bonding the compensated first wafer and the compensated second wafer, performing a third overlay check, the third overlay check including determining whether the first conductive pad of the compensated first wafer is in contact with a corresponding first conductive via, and determining whether the second conductive pad of the compensated first wafer is in contact with a corresponding second conductive via.

In some embodiments, the method further includes determining whether a result of the third overlay check is within a third predetermined specification, in which bonding the compensated first wafer and the compensated second wafer is performed in response to the third overlay check is determined as within the third predetermined specification.

In some embodiments, the first compensation method is performed by a lithography tool, and the second compensation method is performed by a bonder.

In some embodiments, the first compensation method is performed such that the position of the third conductive pad of the compensated second wafer is different from a position of the second conductive pad of the second wafer, and the position of the fourth conductive pad of the compensated second wafer is different from a position of the fourth conductive pad of the second wafer.

In some embodiments, the first compensation method is performed such that the position of the third conductive pad of the compensated second wafer is substantially the same as a position of the second conductive pad of the second wafer, and the position of the fourth conductive pad of the compensated second wafer is substantially the same as a position of the fourth conductive pad of the second wafer.

In some embodiments, the position of the first conductive pad of the compensated first wafer is defined by a first exposure step of a lithography process, and the position of the second conductive pad of the compensated first wafer is defined by a second exposure step of the lithography process, and in which the first exposure step and the second exposure step are performed at different time points.

In some embodiments, a first shift between the position of the first conductive pad of the compensated first wafer and the position of the first conductive pad of the first wafer have a different direction and a different magnitude than a second shift between the position of the second conductive pad of the compensated first wafer and the position of the second conductive pad of the first wafer.

In some embodiments, the first overlay check is performed when the first wafer and the second wafer are under temporary bonding.

In some embodiments, the method further includes performing a first process after bonding the compensated first wafer and the compensated second wafer.

In some embodiments, the method further includes measuring a first wafer shape of the first wafer; after measuring the first wafer shape, forming the first conductive pad over the first wafer; and after forming the first conductive pad over the first wafer, measuring a second wafer shape of the first wafer, in which the first compensation method is performed based on the first wafer shape and the second wafer shape.

In some embodiments of the present disclosure, a compensation method for wafer bonding includes bonding a first wafer and a second wafer, in which the first wafer has a first conductive pad, and the second wafer has a second conductive pad; performing a first process to the first wafer and the second wafer, in which prior to performing the first process, the first conductive pad has a first position, and a first shift is between the first position and an ideal position, and in which after performing the first process, the first conductive pad has a second position, and a second shift is between the second position and the first position; performing a second process to the second wafer, in which after performing the second process, the first conductive pad has a third position, and a third shift is between the third position and the second position; performing a first compensation method to produce a compensated first wafer and a compensated second wafer, the first compensation method including defining a position of a first conductive pad of the compensated first wafer, in which the position of a first conductive pad of the compensated first wafer is determined by the first shift, the second shift, and the third shift; and bonding the compensated first wafer and the compensated second wafer.

In some embodiments, a difference between the position of the first conductive pad of the compensated first wafer and the third position of the first conductive pad of the first wafer is equal to a sum of the first shift, the second shift, and the third shift.

In some embodiments, the method further includes prior to performing the first process, performing a second compensation method, the second compensation method including: separating the first wafer and the second wafer; adjusting relative positions of the first wafer and the second wafer; and re-bonding the first wafer and the second wafer; performing an overlay check, the overlay check including determining whether the first conductive pad of the first wafer is in contact with the second conductive pad of the second wafer; and determining whether a result of the overlay check is within a predetermined specification.

In some embodiments, the first compensation method is performed by a lithography tool, and the second compensation method is performed by a bonder.

In some embodiments, adjusting relative positions of the first wafer and the second wafer includes linearly moving the first wafer with respect to the second wafer; rotating the first wafer with respect to the second wafer; or scaling up the first wafer with respect to the second wafer.

In some embodiments, the ideal position is a position of the first conductive pad under a condition where the first wafer is not distorted during manufacturing process.

In some embodiments, the method further includes measuring a wafer shape of the first wafer; and forming the first conductive pad over the first wafer based on the wafer shape.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1B:
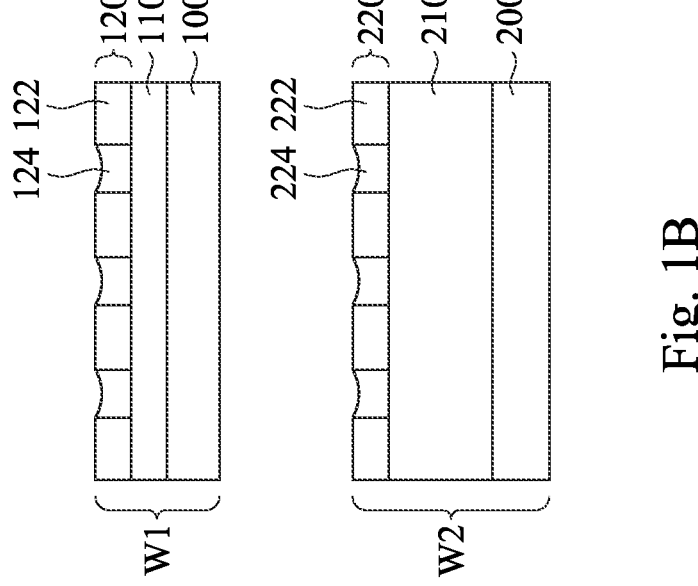
FIGS. 1A to 6B are schematic views of a wafer bonding method at different stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A to 6B are schematic views of a wafer bonding method at different stages in accordance with some embodiments of the present disclosure, in which FIGS. 1B, 2B, 3B, 4B, 5B, and 6B are cross-sectional view of FIGS. 1A, 2A, 3A, 4A, 5A, and 6A, respectively. Moreover, some elements (e.g., bonding layers 120 and 220) of FIGS. 1B, 2B, 3B, 4B, 5B, and 6B are not illustrated in FIGS. 1A, 2A, 3A, 4A, 5A, and 6A for brevity.

Figure 1A:
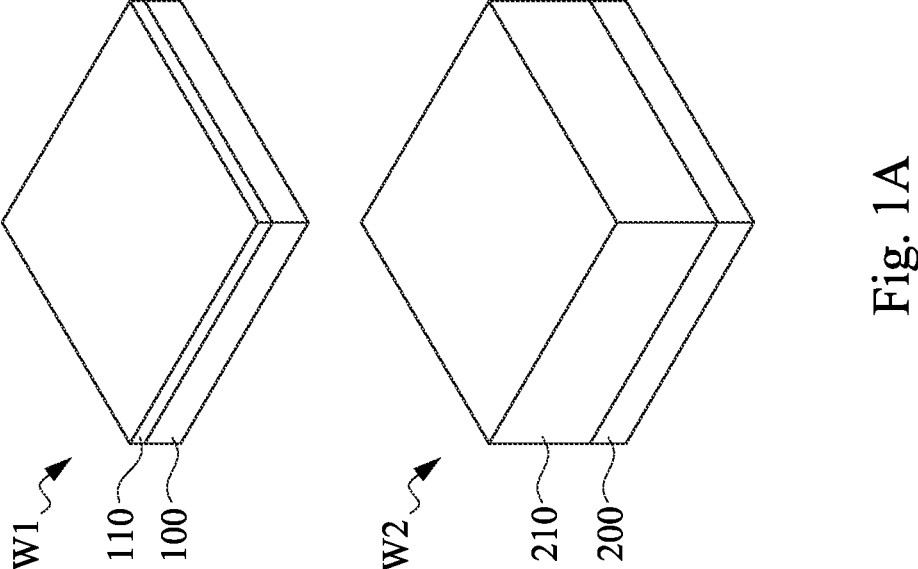

Referring to FIGS. 1A and 1B, shown there are a wafer W1 and a wafer W2. In some embodiments, the wafers W1 and W2 can be manufactured through several semiconductor processes. The semiconductor processes may include deposition, patterning, etching, or other suitable processes, so as to form functional circuits over the wafers W1 and W2.

The wafers W1 and W2 include substrates 100 and 200, respectively. In some embodiments, the substrates 100 and 200 can be semiconductor substrates. The semiconductor substrate may be bulk silicon substrate or silicon-on-insulator (SOI) substrate. In accordance with alternative embodiments of the present disclosure, other semiconductor materials that include group III, group IV, and/or group V elements may also be used, which may include silicon germanium, silicon carbon, and/or III-V compound semiconductor materials.

Semiconductor device 110 is over the substrate 100 of the wafer W1, and semiconductor device 210 is over the substrate 200 of the wafer W2. In some embodiments, the semiconductor devices 110 and 210 may include electrical components, such as transistors, diodes, resistors, capacitors, etc. In some embodiments, the semiconductor device 110 may include memory array, which may include NAND type non-volatile memory. In some embodiments, the memory array of the NAND type non-volatile memory may include three-dimensional (3D) arrangement configuration. In other embodiments, the memory array may also include NOR type or AND type memory array. On the other hand, the semiconductor device 210 may include complementary metal-oxide-semiconductor (CMOS) devices.

Referring to FIG. 1B, the wafers W1 and W2 further includes bonding layers 120 and 220, respectively, in which the bonding layer 120 of the wafer W1 will be bonded to the bonding layer 220 of the wafer W2 in the following discussed bonding process. In some embodiments, the bonding layer 120 includes a dielectric layer 122 and a plurality of conductive pads 124 in the dielectric layer 122. Similarly, the bonding layer 220 includes a dielectric layer 222 and a plurality of conductive pads 224 in the dielectric layer 222.

In some embodiments, the bonding layer 120 may also be referred to as interconnect layer, in which the bonding layer 120 is a topmost layer of the wafer W1, and the conductive pads 124 of the bonding layer 120 are electrically connected to the electrical components within the semiconductor device 110. Similarly, the bonding layer 220 may also be referred to as interconnect layer, in which the bonding layer 220 is a topmost layer of the wafer W2, and the conductive pads 224 of the bonding layer 220 are electrically connected to the electrical components within the semiconductor device 210.

During the following discussed bonding process, the conductive pads 124 of the bonding layer 120 are bonded to the conductive pads 224 of the bonding layer 220, to further electrically connect the semiconductor device 110 of the wafer W1 and the semiconductor device 210 of the wafer W2 with each other.

In some embodiments, the materials of the dielectric layers 122 and 222 may include silicon oxide, silicon nitride, silicon oxy-nitride, tetraethoxysilane (TEOS), phosphosilicate glass (PSG), borophosphosilicate glass (BPSG), low-k dielectric material and/or other suitable dielectric materials.

In some embodiments, the conductive pads 124 and 224 may include metal materials, such as copper (Cu). In other embodiments, the conductive pads 124 and 224 may also include aluminum (Al), tungsten (W), or other suitable metal materials.

FIGS. 2A to 4B will discuss a bonding process between the wafers W1 and W2. The bonding process discussed in FIGS. 2A to 4B can be referred to as hybrid bonding or metal-to-metal bonding. In some embodiments where the conductive pads 124 and 224 are made of Cu, the bonding process may also be referred to as Cu-to-Cu bonding.

In some embodiments, prior to the bonding process discussed in FIGS. 2A to 4B, cleaning process and plasma treatment may be performed to the wafers W1 and W2, in which the cleaning process is used to remove the native oxides over the conductive pads 124 and 224, and the plasma treatment is used to activate the conductive pads 124 and 224.

Figure 2B:
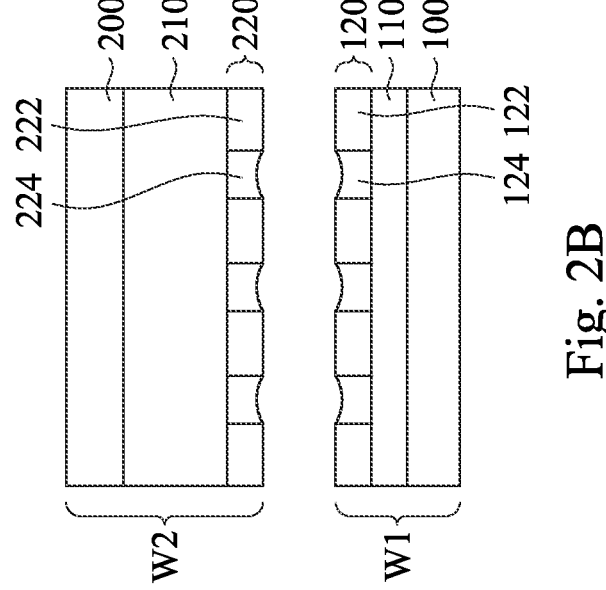
Figure 2A:
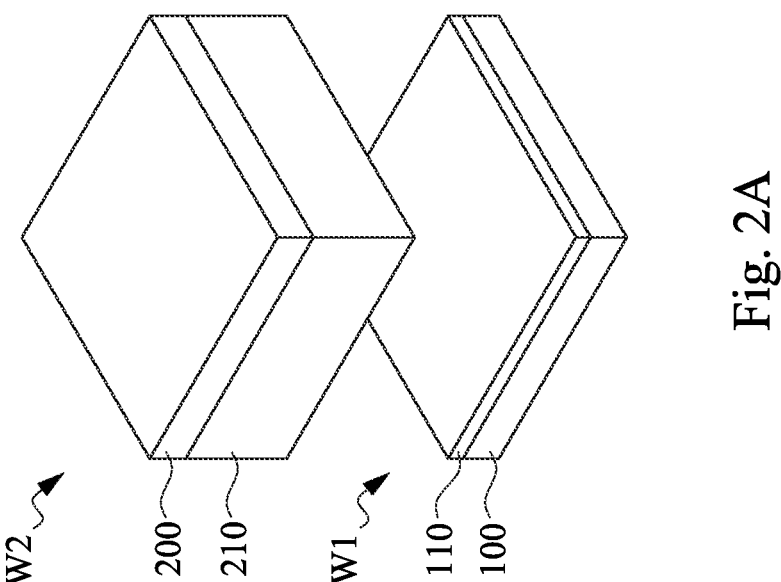

Referring to FIGS. 2A and 2B, one of the wafers W1 and W2 is flipped over. For example, in the embodiments of FIGS. 2A and 2B, the wafer W2 is flipped over by 180 degrees, such that the bonding layer 220 of the wafer W2 faces the bonding layer 120 of the wafer W1. In greater detail, the conductive pads 224 of the bonding layer 220 of the wafer W2 are aligned with the conductive pads 124 of the bonding layer 120 of the wafer W1.

In some embodiments, the wafers W1 and W2 may be bonded together using a bonder. For example, the bonder may include a first wafer supporter and a second wafer supporter, which are configured to support the wafers W1 and W2, respectively. Then, alignment marks on the wafers W1 and W2 are measured to record the positions of the wafers W1 and W2. Afterwards, based on the recorded positions of the wafers W1 and W2, the wafer W1 is aligned with the wafer W2.

Figure 3B:
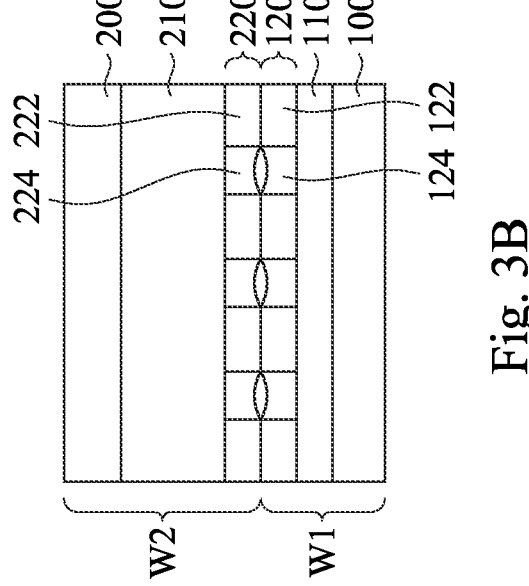
Figure 3A:
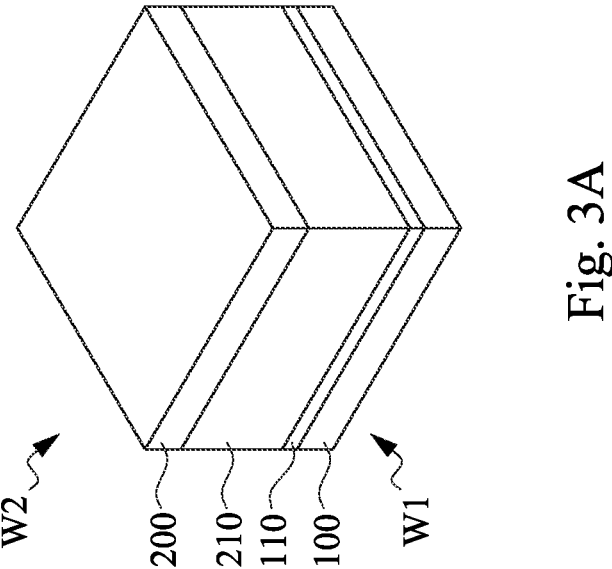

Referring to FIGS. 3A and 3B, the wafers W1 and W2 are bonded, such that the bonding layer 120 of the wafer W1 is in contact with the bonding layer 220 of the wafer W2. The above mentioned bonder may be used to press the wafers W1 and W2 against each other. In greater detail, the conductive pads 124 of the bonding layer 120 of the wafer W1 are in contact with the corresponding conductive pads 224 of the bonding layer 220 of the wafer W2, respectively.

In some embodiments, the bonding step of FIGS. 3A and 3B can be referred to as temporary bonding. This is because at this step, the wafer W2 is lightly pressed against the wafer W1, such that the wafer W1 is in contact with the wafer W2. That is, during the temporary bonding, there is no strong bonding force between the wafers W1 and W2. As a result, a de-bonding process can be performed to separate the wafers W1 and W2, and would not destroy the bonding layers 120 and 220. In some embodiments, the bonding step of FIGS. 3A and 3B is performed under room temperature (such as about 25° C. to about 27° C.).

Figure 4B:
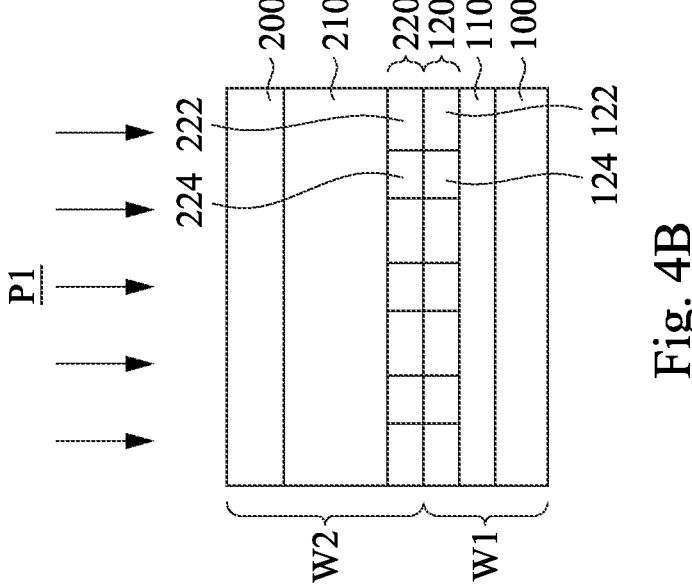
Figure 4A:
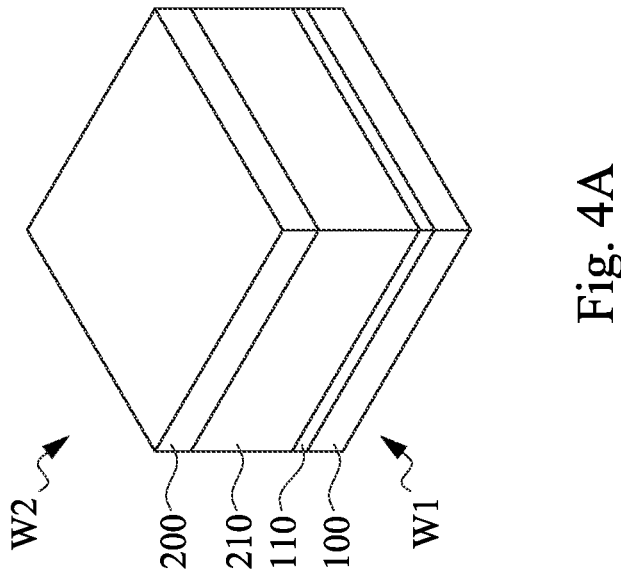

Referring to FIGS. 4A and 4B, a first process P1 is performed. In some embodiments, the first process P1 is an annealing process. In the embodiments where the first process P1 is an annealing process, the annealing process causes inter-diffusion between the metal material of the conductive pads 124 and the metal material of the corresponding conductive pads 224, such that the conductive pads 124 and the corresponding conductive pads 224 are tightly bonded with each other. In some embodiments, the temperature of the annealing process is greater than the temperature of the temporary bonding as discussed in FIGS. 3A and 3B.

Figure 5B:
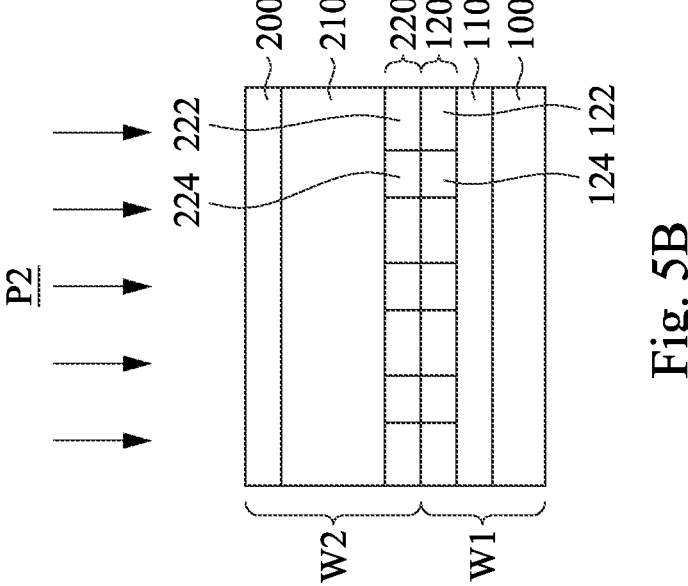
Figure 5A:
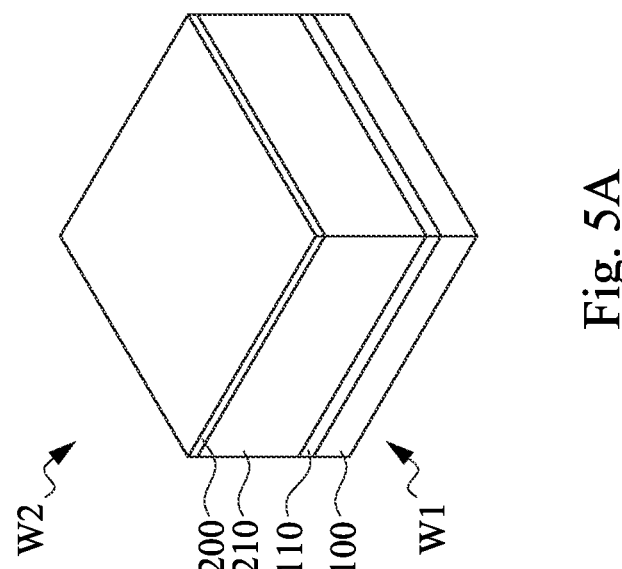

Referring to FIGS. 5A and 5B, a second process P2 is performed to the substrate 200 of the wafer W2. In some embodiments, the second process P2 is a grinding process, so as to reduce the thickness of the substrate 200.

Figure 6B:
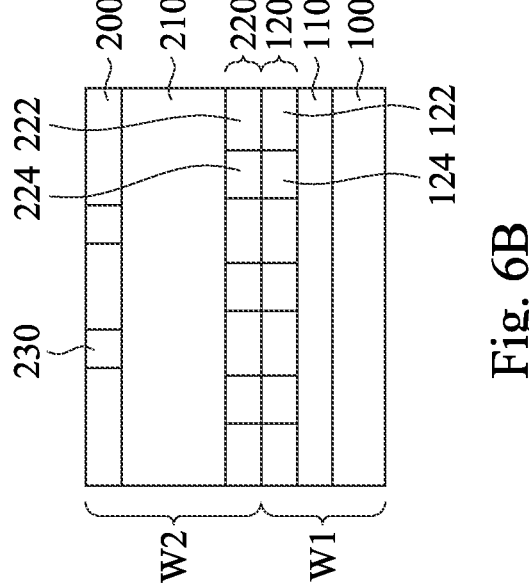
Figure 6A:
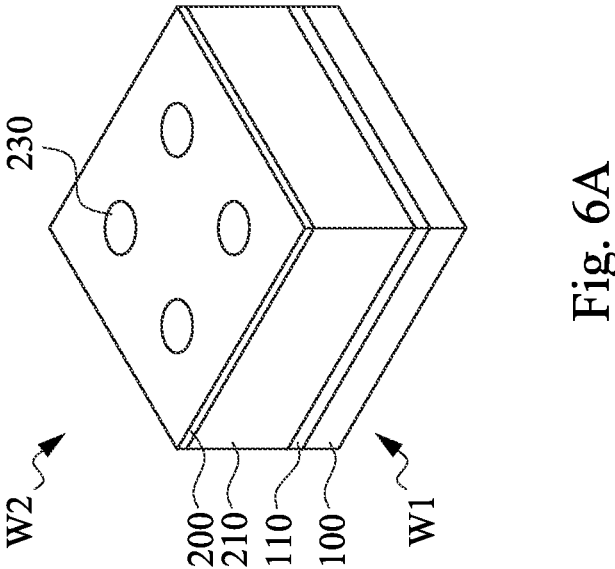

Referring to FIGS. 6A and 6B, conductive features 230 are formed in the substrate 200 of the wafer W2. The conductive features 230 may penetrate through the substrate 200 and are electrically connected with the semiconductor device 210 of the wafer W2. In some embodiments, the conductive features 230 may be formed by patterning the substrate 200 to form openings in the substrate 200, filling conductive materials in the openings, and then performing a polishing process until the substrate 200 is exposed. In some embodiments, the conductive features 230 may include metal materials, such as copper (Cu). In other embodiments, the conductive features 230 may also include aluminum (Al), tungsten (W), or other suitable metal materials. In some embodiments, the conductive features 230 may also be referred to as through silicon vias (TSVs).

Figures 7A, 7B:
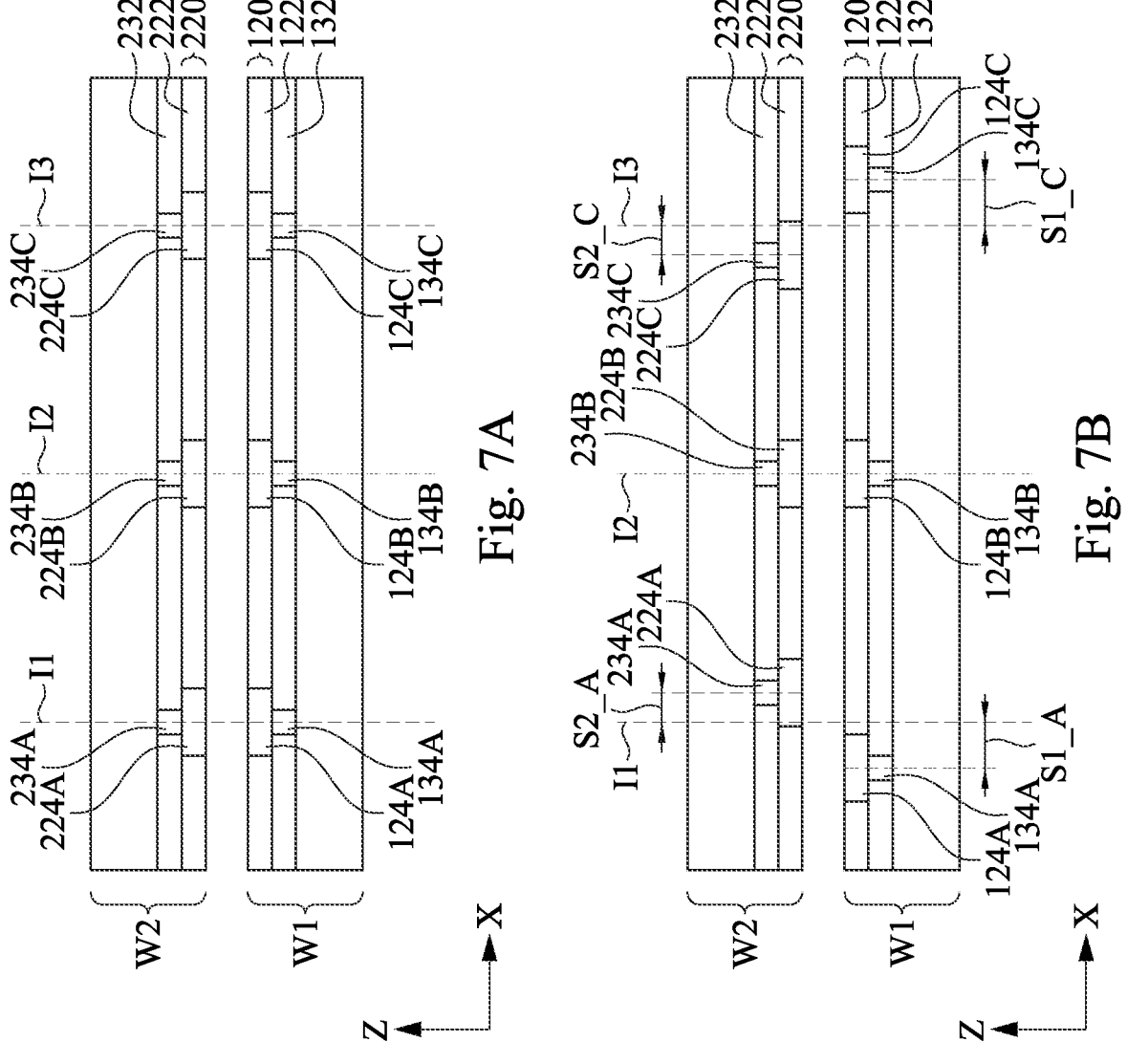
FIGS. 7A and 7B are schematic views of wafer bonding in accordance with some embodiments of the present disclosure.

FIGS. 7A and 7B are schematic views of wafer bonding in accordance with some embodiments of the present disclosure. It is noted that some elements of FIGS. 7A and 7B are the same as those discussed in FIGS. 1A to 6B, such elements are labeled the same, and relevant details will not be repeated for brevity.

FIGS. 7A and 7B are schematic views of bonding between the wafers W1 and W2. In greater detail, conductive pads 124A, 124B, and 124C are disposed in the dielectric layer 122 of the wafer W1. Moreover, the wafer W1 also includes a dielectric layer 132 and conductive vias 134A, 134B, and 134C in the dielectric layer 132, in which the conductive vias 134A, 134B, and 134C are in contact with the conductive pads 124A, 124B, and 124C, respectively. Similarly, conductive pads 224A, 224B, and 224C are disposed in the dielectric layer 222 of the wafer W2. Moreover, the wafer W2 also includes a dielectric layer 232 and conductive vias 234A, 234B, and 234C in the dielectric layer 232, in which the conductive vias 234A, 234B, and 234C are in contact with the conductive pads 224A, 224B, and 224C, respectively. In some embodiments, the dielectric layer 132 and the conductive vias 134A, 134B, and 134C may be referred to as an interconnect layer. Moreover, the dielectric layer 232 and the conductive vias 234A, 234B, and 234C may be referred to as an interconnect layer.

FIG. 7A shows an ideal condition, in which the ideal condition is resulted from that the wafers W1 and W2 are not distorted during the manufacturing processes. Thus, elements of the wafers W1 and W2 are substantially at ideal positions, such that the wafers W1 and W2 may be bonded with each other as predicted. For example, the conductive pad 124A (and conductive via 134A) of the wafer W1 and the conductive pad 224A (and conductive via 234A) of the wafer W2 are both at an ideal position I1, such that conductive pad 124A of the wafer W1 would be in contact with the conductive pad 224A of the wafer W2 after bonding. The conductive pad 124B (and conductive via 134B) of the wafer W1 and the conductive pad 224B (and conductive via 234B) of the wafer W2 are both at an ideal position I2, such that conductive pad 124B of the wafer W1 would be in contact with the conductive pad 224B of the wafer W2 after bonding. The conductive pad 124C (and conductive via 134C) of the wafer W1 and the conductive pad 224C (and conductive via 234C) of the wafer W2 are both at an ideal position I3, such that conductive pad 124C of the wafer W1 would be in contact with the conductive pad 224C of the wafer W2 after bonding.

FIG. 7B shows a real condition in accordance with some embodiments of the present disclosure. Different from FIG. 7A, during the manufacturing processes, the wafers W1 and W2 may be distorted, such as warpage. As an example of FIG. 7B, the wafers W1 and W2 may be bended during the manufacturing processes. As a result, during the bonding process, although the force applied to the wafers W1 and W2 may flatten the wafers W1 and W2, it may also cause displacement to the patterns of the wafers W1 and W2.

For example, in FIG. 7B, the conductive pad 124A (and the conductive via 134A) is shifted toward the −X direction by S1_A with respect to the ideal position I1, and the conductive pad 124C (and the conductive via 134C) is shifted toward the +X direction by S1_C with respect to the ideal position I3.

On the other hand, the conductive pad 224A (and the conductive via 234A) is shifted toward the +X direction by S2_A with respect to the ideal position I1, and the conductive pad 224C (and the conductive via 234C) is shifted toward the −X direction by S2_C with respect to the ideal position I3.

The above condition may result in that the conductive pad 124A of the wafer W1 and the conductive pad 224A of the wafer W2 may not be in contact with each other (or the contact area is less than a predetermined value) after bonding. Similarly, the conductive pad 124C of the wafer W1 and the conductive pad 224C of the wafer W2 may not be in contact with each other (or the contact area is less than a predetermined value) after bonding. Such condition may be referred to as overlay error, which will result in an unsatisfied electrical connection. In some embodiments, the predetermined value of the contact area may be 50% of the junction area of one of the conductive pad 124A and the conductive pad 224A. In some embodiments, the predetermined value of the contact area may be 30% of the junction area of one of the conductive pad 124A and the conductive pad 224A. Here, the "junction area" may be referred to as the total area of the conductive pad 124A (or the conductive pad 224A) that is used to bonded with the conductive pad 224A (or the conductive pad 124A). The predetermined value of the contact area between the conductive pad 124C and the conductive pad 224C may include similar relationship, and will not be repeated for brevity.

In some embodiments, the conductive pad 124B of the wafer W1 and the conductive pad 224B of the wafer W2 are substantially aligned with an ideal position I2. Thus, the conductive pad 124B of the wafer W1 may be in contact with the conductive pad 224B of the wafer W2 to create a satisfied electrical connection.

FIGS. 8A to 8D are schematic views of overlay error in accordance with some embodiments of the present disclosure. FIGS. 8A, 8B, 8C, and 8D show overlay error conditions of translation, rotation, scaling, and random, respectively.

Figures 8A, 8B:
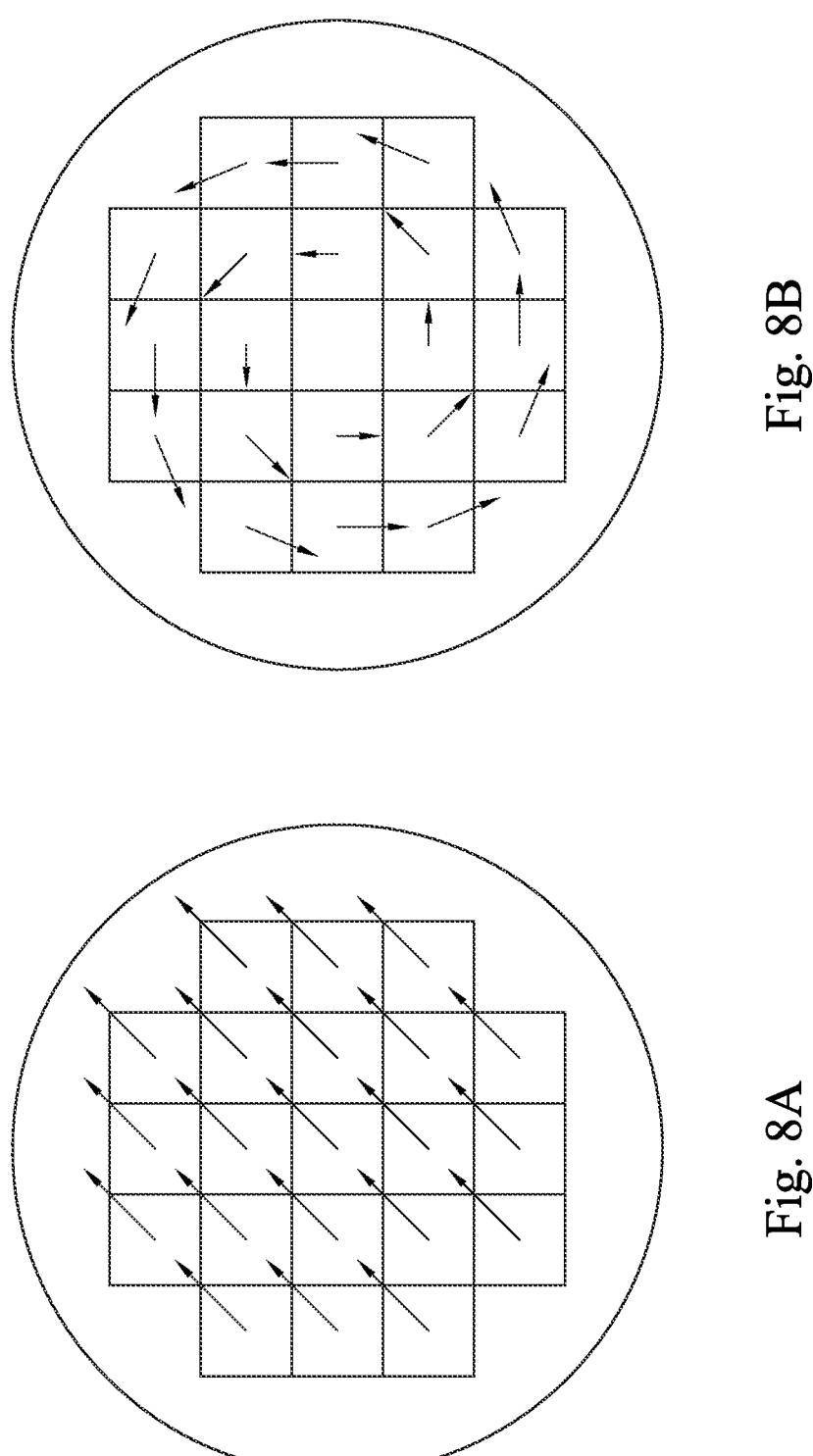
FIGS. 8A to 8D are schematic views of overlay error in accordance with some embodiments of the present disclosure.
Figures 8C, 8D:
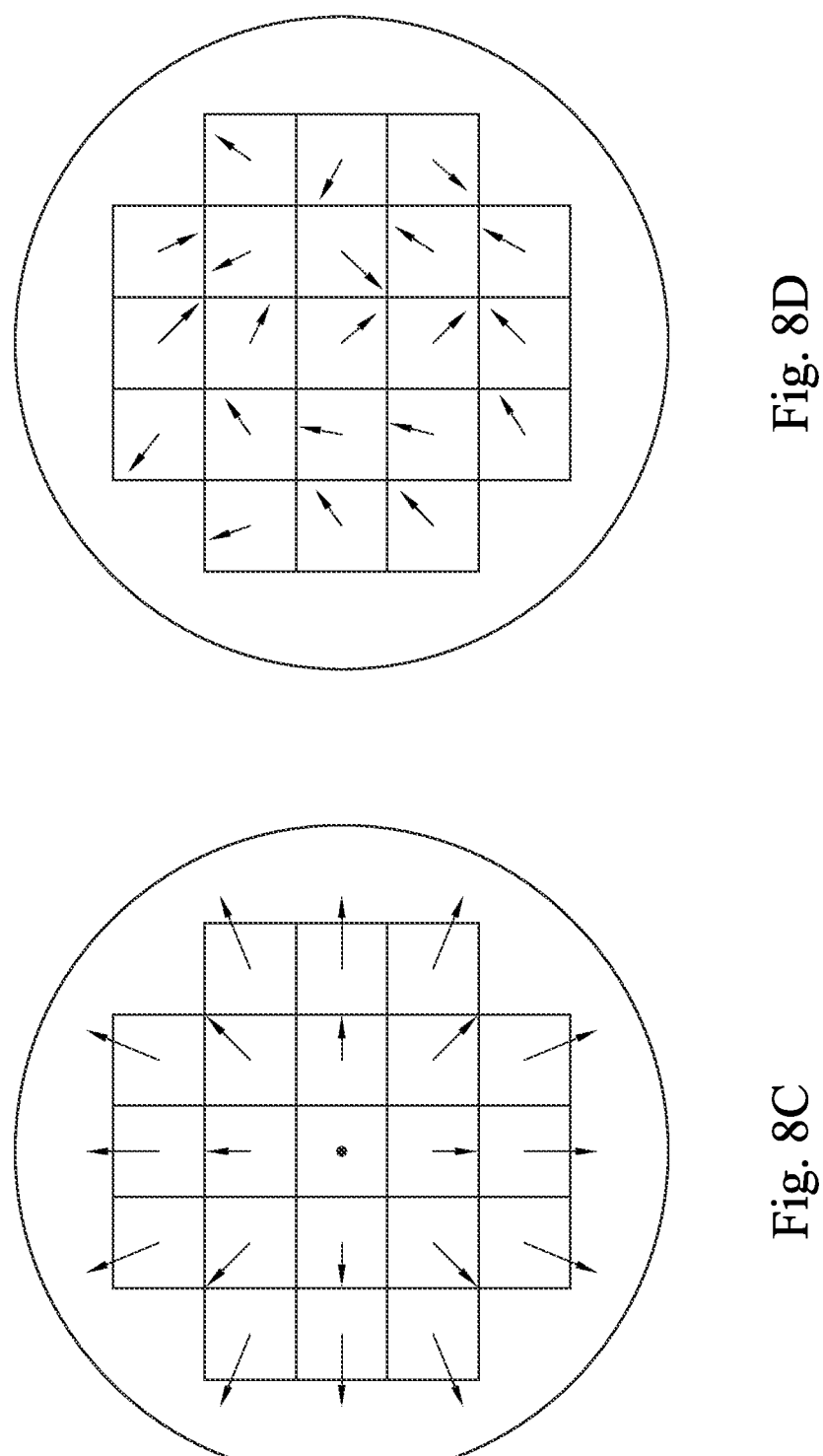

In some embodiments, the overlay error conditions of translation, rotation, and scaling of FIGS. 8A, 8B, and 8C can be fixed by a compensation method to improve the bonding between the wafers W1 and W2. For example, the compensation method may include adjusting the relative positions of wafers W1 and W2 to improve the bonding between the wafers W1 and W2. In the condition of FIG. 8A, the relative positions of wafers W1 and W2 can be adjusted by linearly moving the wafer W1 (or wafer W2). In the condition of FIG. 8B, the relative positions of wafers W1 and W2 can be adjusted by rotating the wafer W1 (or wafer W2). In the condition of FIG. 8C, the relative positions of wafers W1 and W2 can be adjusted by scaling up (or scaling down) the wafer W1 (or wafer W2). For example, the center of the wafer W1 (or the wafer W2) may be applied with a force, such that the wafer W1 may be radially enlarged (or shrunk) from the center to the edge. The above compensation method can be conducted by adjusting the bonding process to improve the bonding between the wafers W1 and W2. For example, referring to FIG. 7B, by performing the above compensation method, the conductive pads 124A and 124C of the wafer W1 can be in contact with the conductive pads 224A and 224C of the wafer W2. In some conditions, such as the deformation of the wafer is too severe due to the manufacturing process, the bonder may not be able to fully compensate the error of wafer scaling up (or scaling down) by applying a center force, and this may result in that the overlay of the wafers W1 and W2 is less than a predetermined level.

Moreover, referring to FIG. 8D, in some embodiments, the random error may not be fixed by using the above compensation method to improve the bonding between the wafers W1 and W2 as well. As a result, another compensation method is needed to improve the bonding between the wafers W1 and W2.

Figure 9:
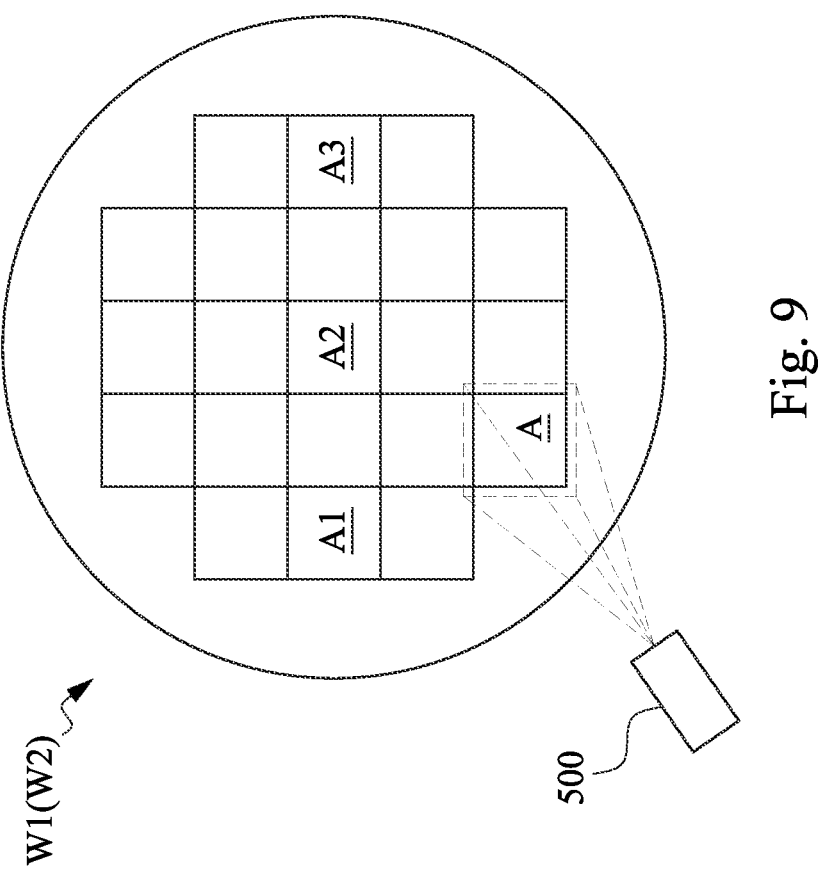
FIG. 9 is a schematic view of a lithography process in accordance with some embodiments of the present disclosure.
Figure 10A:
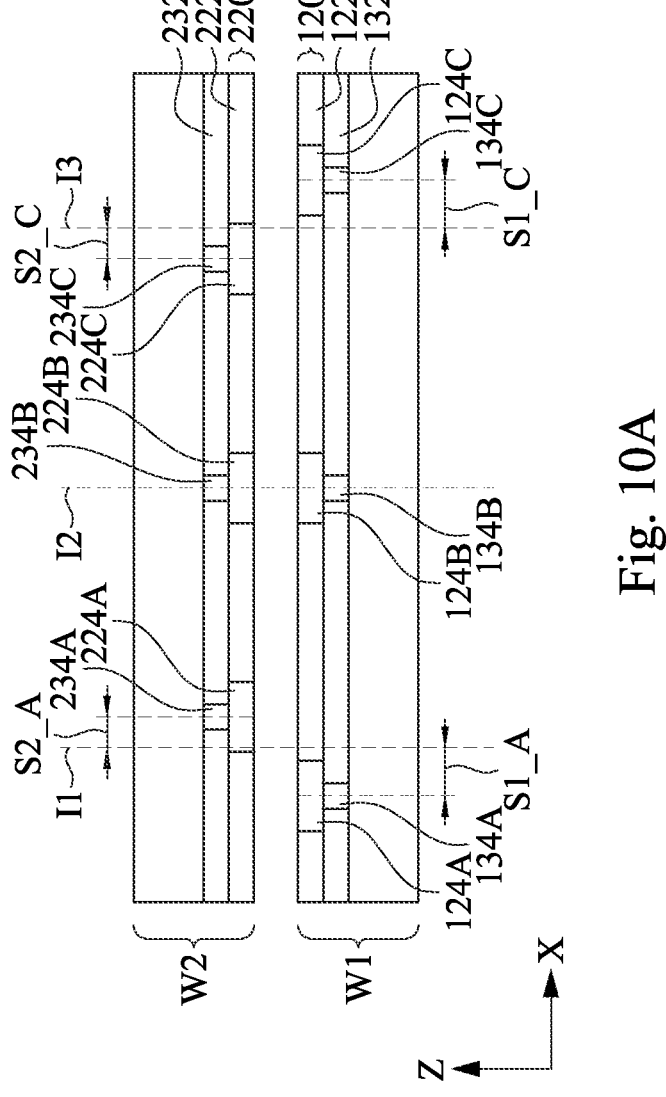
FIG. 10A is a schematic view of bonding result in accordance with some embodiments of the present disclosure.

FIG. 9 is a schematic view of a lithography process in accordance with some embodiments of the present disclosure. FIG. 10A is a schematic view of bonding result in accordance with some embodiments of the present disclosure. FIGS. 10B to 10E are schematic views of compensation methods in accordance with some embodiments of the present disclosure. In greater detail, FIGS. 10B to 10E provide different compensation methods, in which the compensation methods are conducted, based on the bonding result of FIG. 10A, by individually adjusting the exposure shift on different fields of the wafer, so as to obtain a better bonding quality.

Referring to FIG. 9, shown there is the wafer W1 (or wafer W2), in which wafer W1 includes several exposure fields A. During the lithography process, lithography tool 500 (or scanner) may include a light source, the lithography tool 500 may pass the light generated from the light source to an exposure field A of the wafer W1 through a photomask, so as to transfer the pattern of the photomask to a material layer (such as photoresist) within the exposure field A of the wafer W1. The pattern may define the positions of elements on the wafer W1, such as the positions of the conductive pads 124A, 124B, and 124C. For example, by forming a photoresist layer over the dielectric layer 122 of the wafer W1, performing an exposure process to the photoresist layer to transfer the pattern of the photomask onto the photoresist layer, etching the dielectric layer 122 through the pattern of the photoresist layer to form openings, in which the shapes and the positions of the openings correspond to the pattern of the photoresist layer. Finally, the conductive pads 124A, 124B, and 124C are formed in the openings. In other words, the positions of the conductive pads 124A, 124B, and 124C are defined by the exposure process of the lithography process. Accordingly, by adjusting the exposure position, the positions of the conductive pads 124A, 124B, and 124C on the wafer W1 can be changed. Similarly, by adjusting the exposure position, the positions of the conductive pads 224A, 224B, and 224C on the wafer W2 can be changed.

Referring to FIGS. 9 and 10A, in which FIG. 10A is the same as FIG. 7B. In some embodiments, the conductive pads 124A, 124B, and 124C of the wafer W1 may correspond to different exposure fields of the wafer W1. For example, the conductive pad 124A may correspond to the exposure field A1 of the wafer W1, the conductive pad 124B may correspond to the exposure field A2 of the wafer W1, and conductive pad 124C may correspond to the exposure field A3 of the wafer W1. That is, during the exposure process of the lithography process, the position of the conductive pad 124A is defined by performing a first exposure step to the exposure field A1 of the wafer W1, the position of the conductive pad 124B is defined by performing a second exposure step to the exposure field A2 of the wafer W1, and the position of the conductive pad 124C is defined by performing a third exposure step to the exposure field A3 of the wafer W1. The first, second, and third exposure steps are performed at different time points, and thus the positions of the conductive pads 124A, 124B, and 124C can be adjusted individually. In some embodiments, the exposure field A2 is at the center region of the wafer W1, and the exposure fields A1 and A3 are at the edge regions of the wafer W1, while the present disclosure is not limited thereto.

Similarly, the positions of the conductive pads 224A, 224B, and 224C of the wafer W2 may also be defined by different exposure steps of the lithography process, and thus relevant details will not be repeated.

Figures 10B, 10C:
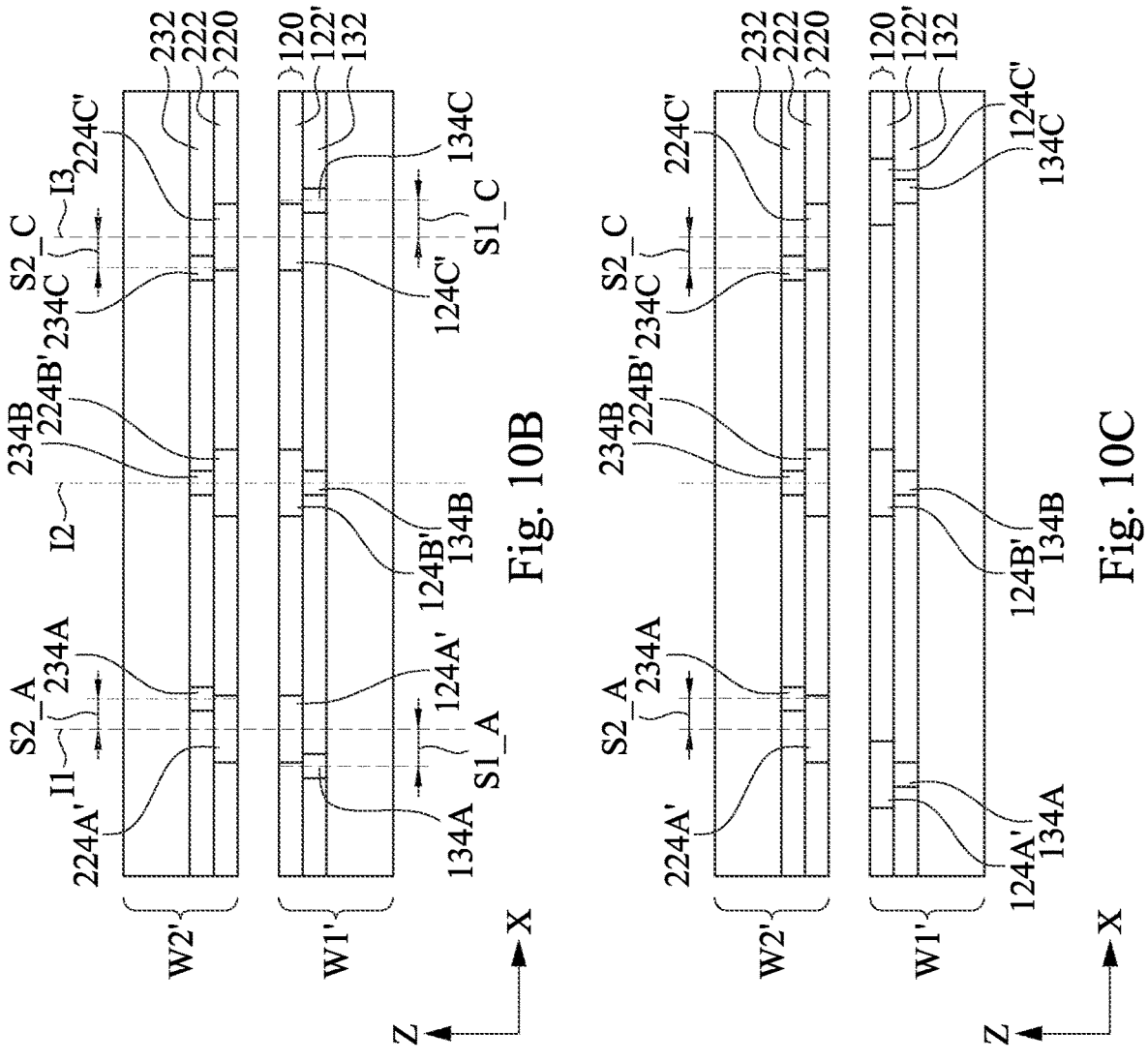
FIGS. 10B to 10E are schematic views of compensation methods in accordance with some embodiments of the present disclosure.

Referring to FIGS. 9 and 10B, a compensation method is performed based on the bonding result of the wafers W1 and W2 of FIG. 10A, so as to produce a new wafer W1' and a new wafer W2'. Referring to the wafer W1', the conductive pad 124A' of the wafer W1' is shifted with respect to the conductive pad 124A of the wafer W1 by S1_A, and the conductive pad 124C' of the wafer W1' is shifted with respect to the conductive pad 124C of the wafer W1 by S1_C. That is, during the first exposure step for forming the conductive pad 124A', the exposure of the exposure field A1 can be shifted by S1_A. During the third exposure step for forming the conductive pad 124C', the exposure of the exposure field A3 can be shifted by S1_C. In some embodiments, because the shifts S1_A and S1_C are defined by different exposure steps, the shifts S1_A and S1_C may include different directions and different magnitudes, which is beneficial to improve the flexibility of adjusting the positions of the conductive pads.

Similarly, the conductive pad 224A' of the wafer W2' is shifted with respect to the conductive pad 224A of the wafer W2 by S2_A, and the conductive pad 224C' of the wafer W2' is shifted with respect to the conductive pad 224C of the wafer W2 by S2_C. That is, during the first exposure step for forming the conductive pad 224A', the exposure of the exposure field A1 can be shifted by S2_A. During the third exposure step for forming the conductive pad 224C', the exposure of the exposure field A3 can be shifted by S2_C. In some embodiments, because the shifts S2_A and S2_C are defined by different exposure steps, the shifts S2_A and S2_C may include different directions and different magnitudes, which is beneficial to improve the flexibility of adjusting the positions of the conductive pads.

In some embodiments, the position of the conductive pad 124B' of the wafer W1' is substantially the same as the position of the conductive pad 124B of the wafer W1. Similarly, the position of the conductive pad 224B' of the wafer W2' is substantially the same as the position of the conductive pad 224B of the wafer W2. That is, during the second exposure for forming the conductive pad 124B' (or conductive pad 224B'), there is no shift to the exposure field A2.

After the compensation method of FIG. 10B is completed, the conductive pads 124A', 124B', and 124C' of the wafer W1' would be in contact with the conductive pads 224A', 224B', and 224C' of the wafer W2' after the bonding process. Accordingly, the compensated wafers W1' and W2' improve the overlay error of the wafers W1 and W2 as discussed in FIG. 10A.

Referring to FIGS. 9 and 10C, a compensation method is performed based on the bonding result of the wafers W1 and W2 of FIG. 10A, so as to produce a new wafer W1' and a new wafer W2'. Different from FIG. 10B, the compensation method of FIG. 10C is performed only to the wafer W2', and is not performed to the wafer W1'. That is, the processing condition of the wafer W1' is substantially the same as the processing condition of the wafer W1. In greater detail, the positions of the conductive pads 124A', 124B', and 124C' of the wafer W1' are the same as the positions of the conductive pads 124A, 124B, and 124C of the wafer W1. The compensation method performed to the wafer W2' is similar to those described in FIG. 10B, and thus relevant details will not be repeated.

After the compensation method of FIG. 10C is completed, the conductive pads 124A', 124B', and 124C' of the wafer W1' would be in contact with the conductive pads 224A', 224B', and 224C' of the wafer W2' after the bonding process. Accordingly, the compensated wafers W1' and W2' improve the overlay error of the wafers W1 and W2 as discussed in FIG. 10A.

In some embodiments, because the compensation method is performed only to the wafer W2', and thus the wafer W1' may not be a new wafer. As mentioned above, during the temporary bonding discussed in FIG. 3A, the wafers W1 and W2 are not tightly bonded, a de-bonding process may be performed to separate the wafers W1 and W2, and would not destroy the wafers W1 and W2. Accordingly, the compensated wafer W2' may be bonded to the original wafer W1, so as to prevent discarding the original wafer W1.

Figures 10D, 10E:
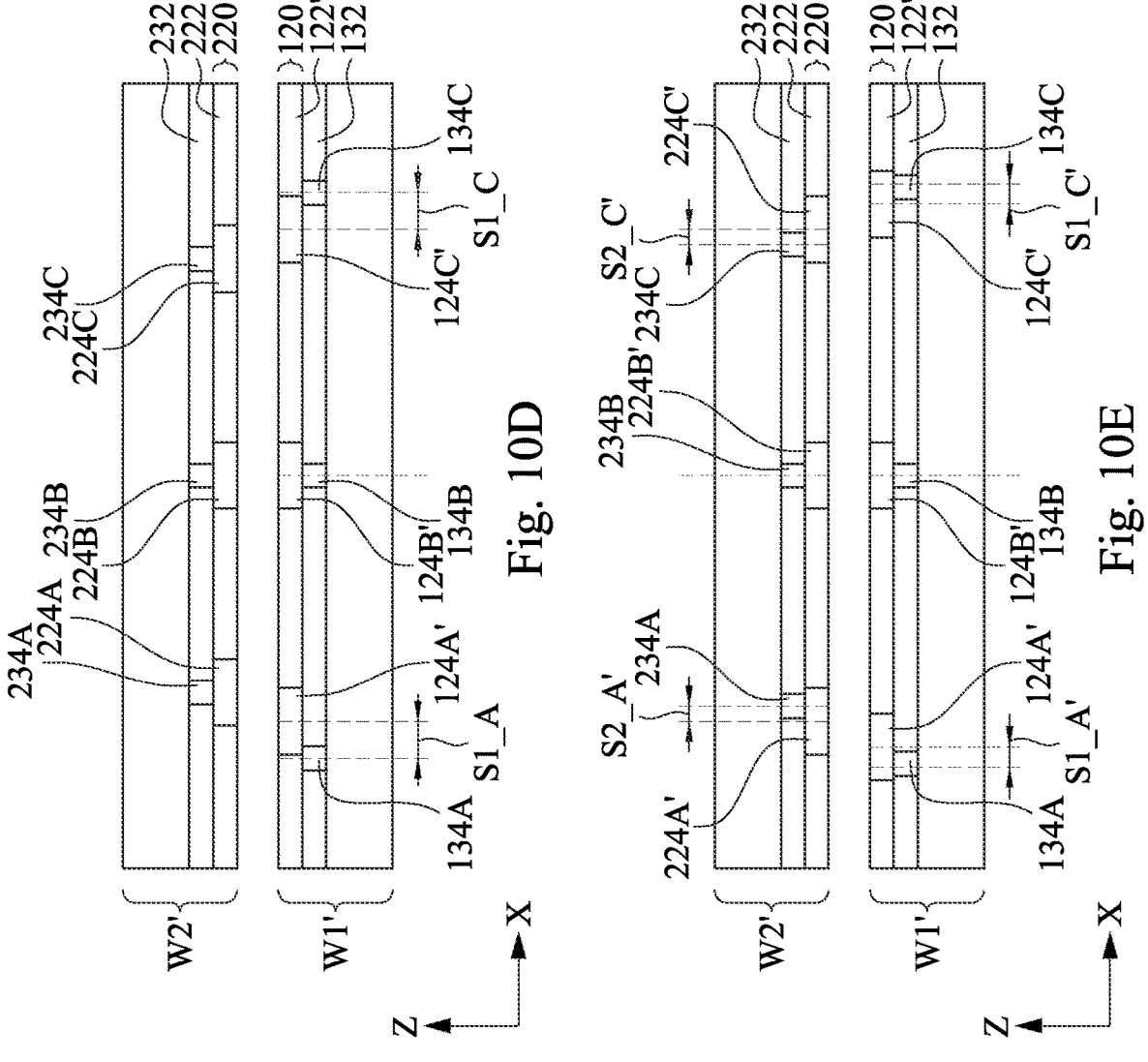

Referring to FIGS. 9 and 10D, a compensation method is performed based on the bonding result of the wafers W1 and W2 of FIG. 10A, so as to produce a new wafer W1' and a new wafer W2'. Different from FIG. 10B, the compensation method of FIG. 10D is performed only to the wafer W1', and is not performed to the wafer W2'. That is, the processing condition of the wafer W2' is substantially the same as the processing condition of the wafer W2. In greater detail, the positions of the conductive pads 224A', 224B', and 224C' of the wafer W2' are the same as the positions of the conductive pads 224A, 224B, and 224C of the wafer W2. The compensation method performed to the wafer W1' is similar to those described in FIG. 10B, and thus relevant details will not be repeated.

After the compensation method of FIG. 10D is completed, the conductive pads 124A', 124B', and 124C' of the wafer W1' would be in contact with the conductive pads 224A', 224B', and 224C' of the wafer W2' after the bonding process. Accordingly, the compensated wafers W1' and W2' improve the overlay error of the wafers W1 and W2 as discussed in FIG. 10A.

In some embodiments, because the compensation method is performed only to the wafer W1', and thus the wafer W2' may not be a new wafer. As mentioned above, during the temporary bonding discussed in FIG. 3A, the wafers W1 and W2 are not tightly bonded, a de-bonding process may be performed to separate the wafers W1 and W2, and would not destroy the wafers W1 and W2. Accordingly, the compensated wafer W1' may be bonded to the original wafer W2, so as to prevent discarding the original wafer W2.

Referring to FIGS. 9 and 10E, a compensation method is performed based on the bonding result of the wafers W1 and W2 of FIG. 10A, so as to produce a new wafer W1' and a new wafer W2'. The compensation method of FIG. 10E is similar to the compensation method of FIG. 10B, in which both the wafers W1' and W2' are compensated. However, in the embodiments of FIG. 10B, the shift S1_A, the shift S1_C, the shift S2_A, and the shift S2_C are determined by the ideal positions of the conductive pads 124A, 124C, 224A, and 224C (as discussed in FIG. 7B), respectively. The conductive pads 124A', 124C', 224A', and 224C' of the wafers W1' and W2' are moved toward the ideal positions, such that the conductive pad 124A' can be completely aligned with the conductive pad 224A', and the conductive pad 124C' can be completely aligned with the conductive pad 224C'. However, this may result in that the conductive pads 124A', 124C', 224A', and 224C' are shifted from the corresponding conductive vias 134A, 134C, 234A, and 234C, respectively. If the shifts are too large, additional electrical connection issues may occur.

Accordingly, in the compensation method of FIG. 10E, the conductive pad 124A' of the wafer W1' is shifted with respect to the conductive pad 124A of the wafer W1 by S1_A', in which the shift S1_A' is less than the shift S1_A discussed in FIG. 10B. The conductive pad 124C' of the wafer W1' is shifted with respect to the conductive pad 124C of the wafer W1 by S1_C', in which the shift S1_C' is less than the shift S1_C discussed in FIG. 10B. Similarly, the conductive pad 224A' of the wafer W2' is shifted with respect to the conductive pad 224A of the wafer W2 by S2_A', in which the shift S2_A' is less than the shift S2_A discussed in FIG. 10B. The conductive pad 224C' of the wafer W2' is shifted with respect to the conductive pad 224C of the wafer W2 by S2_C', in which the shift S2_C' is less than the shift S2_C discussed in FIG. 10B. The above method may ensure that the conductive pads 124A' and 224A' are in partial contact, and the conductive pads 124C' and 224C' are in partial contact. On the other hand, the method also ensures that the conductive pads 124A', 124C', 224A', and 224C' and the corresponding conductive vias 134A', 134C', 234A', and 234C' maintain reliable electrical connections.

Referring to FIGS. 10B and 10E, in some embodiments, after using the compensation method of FIG. 10B to produce the compensated wafers W1' and W2', and overlay check may be performed to the compensated wafers W1' and W2', so as to determine whether elements of the wafers W1' and W2' include reliable electrical connections. For example, it is determined that whether the conductive pads 124A', 124C', 224A', and 224C' are in contact with the corresponding conductive vias 134A', 134C', 234A', and 234C'. If the conductive pads 124A', 124C', 224A', and 224C' are not in contact with the corresponding conductive vias 134A', 134C', 234A', and 234C' (or the contact area is less than a predetermined value), the method discussed in FIG. 10B should be modified. In some embodiments, the method discussed in FIG. 10E can be used to replace the method discussed in FIG. 10B. In some embodiments, the predetermined value of the contact area may be 50% of the junction area of one of the conductive pad 124A' and the conductive via 134A. In some embodiments, the predetermined value of the contact area may be 30% of the junction area of one of the conductive pad 124A' and the conductive via 134A. Here, the "junction area" may be referred to as the total area of the conductive pad 124A (or the conductive via 134A) that is used to bonded with the conductive via 134A (or the conductive pad 124A). The predetermined value of the contact area between the conductive pad 124C' and the conductive via 134C, the predetermined value of the contact area between the conductive pad 224A' and the conductive via 234A, and the predetermined value of the contact area between the conductive pad 224C' and the conductive via 234C may include similar relationship, and will not be repeated for brevity.

Figure 11:
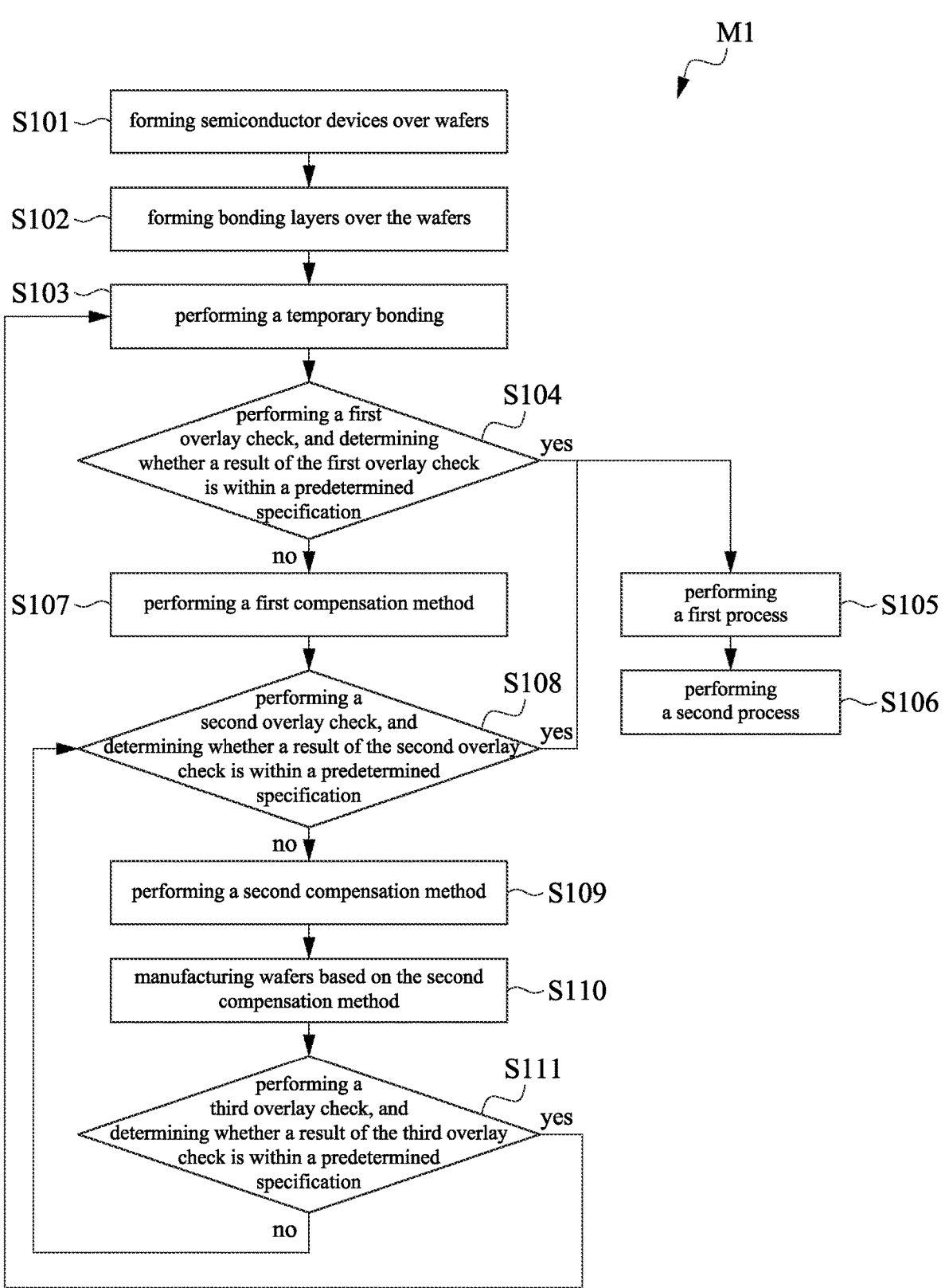
FIG. 11 is a flow chart of a compensation method in accordance with some embodiments of the present disclosure.
Figure 12:
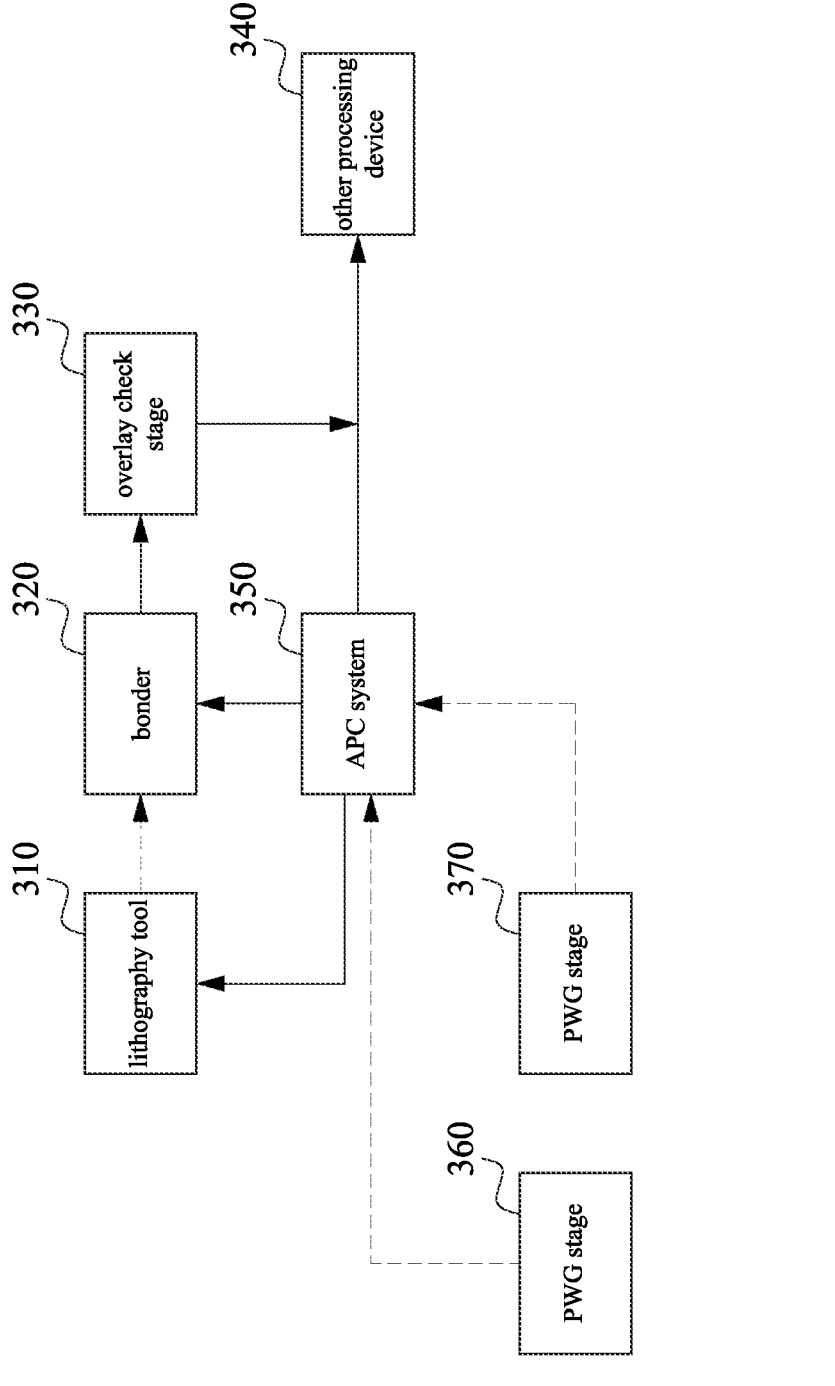
FIG. 12 is a block diagram of a compensation method in accordance with some embodiments of the present disclosure.

FIG. 11 is a flow chart of a compensation method in accordance with some embodiments of the present disclosure. FIG. 12 is a block diagram of a compensation method in accordance with some embodiments of the present disclosure. Although FIG. 11 is described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part. It is noted that, the first compensation method and the second compensation method of FIG. 11 merely indicate that they are compensation methods at different stages, and would not limit the order thereof. Similarly, the first overlay check, the second overlay check, and the third overlay check of FIG. 11 merely indicate that they are overlay checks at different stages, and would not limit the order thereof.

The method M1 of FIG. 11 starts from step S101 by forming semiconductor devices over wafers. For example, referring to FIGS. 1A and 1B, semiconductor device 110 can be formed over the substrate 100 of the wafer W1, and semiconductor device 210 can be formed over the substrate 200 of the wafer W2. In other embodiments, the step S101 may also include forming interconnect structures over the wafers, such as the dielectric layers 132 and 232, and the conductive vias 134A to 134C and 234A to 234C of FIG. 10A.

The method proceeds to step S102 by forming bonding layers over the wafers. For example, referring to FIGS. 1A and 1B, bonding layers 120 and 220 are formed over the wafers W1 and W2, respectively. In some embodiments, the bonding layers 120 and 220 may be formed using the lithography tool 310 (or scanner) of FIG. 12. For example, the positions of the conductive pads 124 and 224 of the bonding layers 120 and 220 are defined by the lithography tool 310.

The method proceeds to step S103 by performing a temporary bonding. For example, referring to FIGS. 2A to 3B, a temporary bonding may be performed to the wafers W1 and W2. In some embodiments, the temporary bonding can be performed using the bonder 320 of FIG. 12. For example, the bonder 320 may include a first wafer supporter and a second wafer supporter, which are configured to support the wafers W1 and W2, respectively. Then, by measuring the alignment marks on the wafers W1 and W2 to record the positions of the wafers W1 and W2. Afterwards, based on the recorded positions of the wafers W1 and W2, the wafer W1 is aligned with the wafer W2. Finally, the wafers W1 and W2 are pressed against each other, such that the wafers W1 and W2 are in contact with each other. During the temporary bonding, the wafers W1 and W2 are not tightly bonded, and thus the wafers W1 and W2 can still be de-bonded from each other.

The method proceeds to step S104 by performing a first overlay check, and determining whether a result of the first overlay check is within a predetermined specification. In some embodiments, the first overlay check includes determining the bonding layers 120 and 220 of the wafers W1 and W2 form an electrical connection as predicted. For example, as shown in FIGS. 7A and 7B, the first overlay check includes determining whether the conductive pads 124A, 124B, and 124C of wafer W1 are in contact with the respective conductive pads 224A, 224B, and 224C of wafer W2, respectively. If the conductive pads 124A, 124B, and 124C of wafer W1 are all in contact with (or the contact area is greater than a predetermined value) the respective conductive pads 224A, 224B, and 224C of wafer W2, the result of the first overlay check is determined as within the predetermined specification (IN SPEC). However, if one of the conductive pads 124A, 124B, and 124C of wafer W1 is not in contact with (or the contact area is less than a predetermined value) the respective one of the conductive pads 224A, 224B, and 224C of wafer W2, the result of the first overlay check is determined as beyond the predetermined specification (OUT SPEC).

If the result of the first overlay check of step S104 is determined as within the predetermined specification, the method proceeds to step S105 by performing a first process. In some embodiments, the first process may be the first process P1 as discussed in FIGS. 4A and 4B, such as an annealing process. Then, after the step S105, the method proceeds to step S106 by performing a second process. In some embodiments, the second process may be the second process P2 as discussed in FIGS. 5A and 5B, such as a grinding process, or the process as discussed in FIGS. 6A and 6B, and thus relevant details will not be repeated. In FIG. 12, the wafers W1 and W2, which are determined as within the predetermined specification, can be transferred to other processing device 340 for the second process.

Referring back to step S104, if the result of the first overlay check of step S104 is determined as beyond the predetermined specification, the method proceeds to step S107 by performing a first compensation method. If the result of the first overlay check is determined as beyond the predetermined specification, this may indicate that overlay error occurs. For example, one of the conductive pads 124A, 124B, and 124C of wafer W1 is not in contact with (or the contact area is less than a predetermined value) the respective one of the conductive pads 224A, 224B, and 224C of wafer W2.

Because the wafers W1 and W2 are under temporary bonding, the first compensation method includes separating the wafers W1 and W2 using the bonder 320 of FIG. 12. Then, the first compensation method may include the compensation methods as discussed in FIGS. 8A to 8C, and thus relevant details will not be repeated. In some embodiments, the first compensation method may be performed using the bonder 320, which includes separating the wafers W1 and W2, adjusting relative positions of the wafers W1 and W2, and then re-bonding the wafers W1 and W2.

The method proceeds to step S108 by performing a second overlay check, and determining whether a result of the second overlay check is within a predetermined specification. In greater detail, the second overlay check is performed after the first compensation method. In some embodiments, the second overlay check includes determining whether the bonding layers 120 and 220 of the compensated wafers W1 and W2 form an electrical connection as predicted. Details of the second overlay check may be similar to those described with respect to the first overlay check, and thus relevant details will not be repeated. In some embodiments, the second overlay check may be performed by the overlay check stage 330 of FIG. 12.

If the result of the second overlay check of step S108 is determined as within the predetermined specification, the method proceeds to step S105 by performing a first process. Then, after step 105, the method proceeds to step S106 by performing a second process.

If the result of the second overlay check of step S108 is determined as beyond the predetermined specification, the method proceeds to step S109 by performing a second compensation method. In some embodiments, the second compensation method may include the compensation methods as discussed in FIG. 10B to 10E, and thus relevant details will not be repeated. In some embodiments, the second compensation method includes designing compensated wafers W1' and W2', such that the compensated wafers W1' and W2' include better bonding result. For example, the second compensation method may include modifying the positions of the conductive pads 124A to 124C and the positions of the conductive pads 224A to 224C of FIG. 10A to the positions of the conductive pads 124A' to 124C' and the positions of the conductive pads 224A' to 224C' of FIGS. 10B to 10E, respectively.

The method proceeds to step S110 by manufacturing wafers based on the second compensation method. In some embodiments, compensated wafers W1' and/or W2' can be re-produced based on the compensation methods as discussed in FIG. 10B to 10E. In some embodiments, the lithography tool 310 of FIG. 12 may be used to define the positions of the conductive pads 124A' to 124C' and the positions of the conductive pads 224A' to 224C' of FIGS. 10B to 10E on the compensated wafers W1' and W2', respectively.

The method proceeds to step S111 by performing a third overlay check, and determining whether a result of the third overlay check is within a predetermined specification. In some embodiments, the third overlay check is different from the first overlay check and the second overlay check discussed above. For example, the first overlay check and the second overlay check may include using suitable method to detect the bonding condition between wafers W1 and W2 (or wafers W1' and W2'). The third overlay check includes determining whether the conductive pads 124A' to 124C' of the wafer W1' are in contact with the respective conductive vias 134A to 134C, and determining whether the conductive pads 224A' to 224C' of the wafer W2' are in contact with the respective conductive vias 234A to 234C. If the conductive pads 124A', 124B', and 124C' of the wafer W1' are all in contact with (or the contact area is greater than a predetermined value) the respective conductive vias 134A to 134C, the result of the third overlay check is determined as within the predetermined specification (IN SPEC). However, if one of the conductive pads 124A', 124B', and 124C' of the wafer W1' is not in contact with (or the contact area is less than a predetermined value) the respective one of the conductive vias 134A to 134C, the result of the third overlay check is determined as beyond the predetermined specification (OUT SPEC). Performing the third overlay check to the wafer W2' is similar to those described with respect to the wafer W1', and thus relevant details will not be repeated. In some embodiments, the third overlay check can be performed using the overlay check stage 330 of FIG. 12.

If the result of the third overlay check is determined as within the predetermined specification, the method proceeds to step S103. Here, a temporary bonding can be performed to the compensated wafers W1' and W2'. Then, the method can proceed to step S104 (and the following steps) to complete the bonding between the wafers W1' and W2'.

If the result of the third overlay check is determined as beyond the predetermined specification, the method proceeds to step S108. In some embodiments, if the result of the third overlay check is determined as beyond the predetermined specification, the second compensation method is redone, and the result of the redone second compensation method is different from the result of the previous second compensation method. For example, the wafers W1' and W2' may be manufactured using the compensation method as discussed in FIG. 10B. If the result overlay check for the structure of FIG. 10B is beyond the predetermined specification, the compensation method of FIG. 10B can be modified with the compensation method of FIG. 10E, so as to produce other wafers W1' and W2'.

Referring to FIG. 12, the result generated from the overlay check stage 330 can be sent to an advanced process control (APC) system 350. Moreover, FIG. 12 also includes patterned wafer geometry (PWG) stage 360 and PWG stage 370. In some embodiments, the PWG stages 360 and 370 may include wafer shape monitor for measuring the wafer shape, such as wafer warpage.

In some embodiments, the PWG stage 360 may be used to measure the wafer shapes of the wafers W1 and W2 (or the wafers W1' and W2') prior to performing the step S102. In greater detail, prior to forming the bonding layers 120 and 220, the shapes of the wafers W1 and W2 (or the wafers W1' and W2') are measured. On the other hand, the PWG stage 370 may be used to measure the wafer shapes of the wafers W1 and W2 (or the wafers W1' and W2') after performing the step S102. In greater detail, after forming the bonding layers 120 and 220, the wafer shapes of the wafers W1 and W2 (or the wafers W1' and W2') are measured.

For example, each time when performing the method M1, several wafer shape data of the wafers W1 and W2 (or the wafers W1' and W2') can be recorded using the PWG stage 360, and several wafer shape data of the wafers W1 and W2 (or the wafers W1' and W2') can be recorded using the PWG stage 370. Then, the APC system 350 may collect the data from the PWG stages 360 and 370 and the overlay check stage 330. The lithography tool 310 and the bonder 320 can adjusting the first compensation method and the second compensation method based on the collected data, so as to obtain a better bonding quality.

Figure 13:
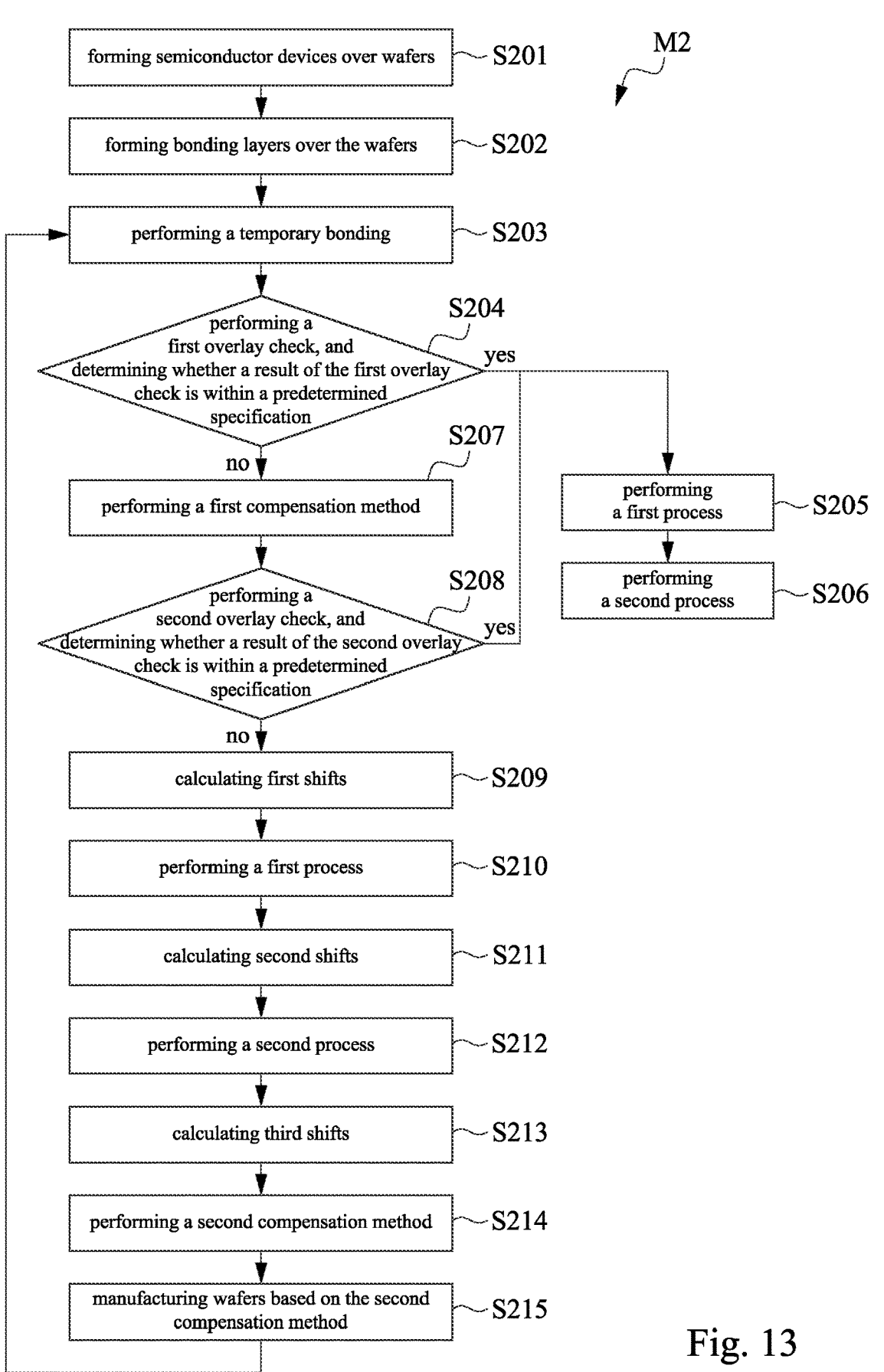
FIG. 13 is a flow chart of a compensation method in accordance with some embodiments of the present disclosure.
Figure 14:
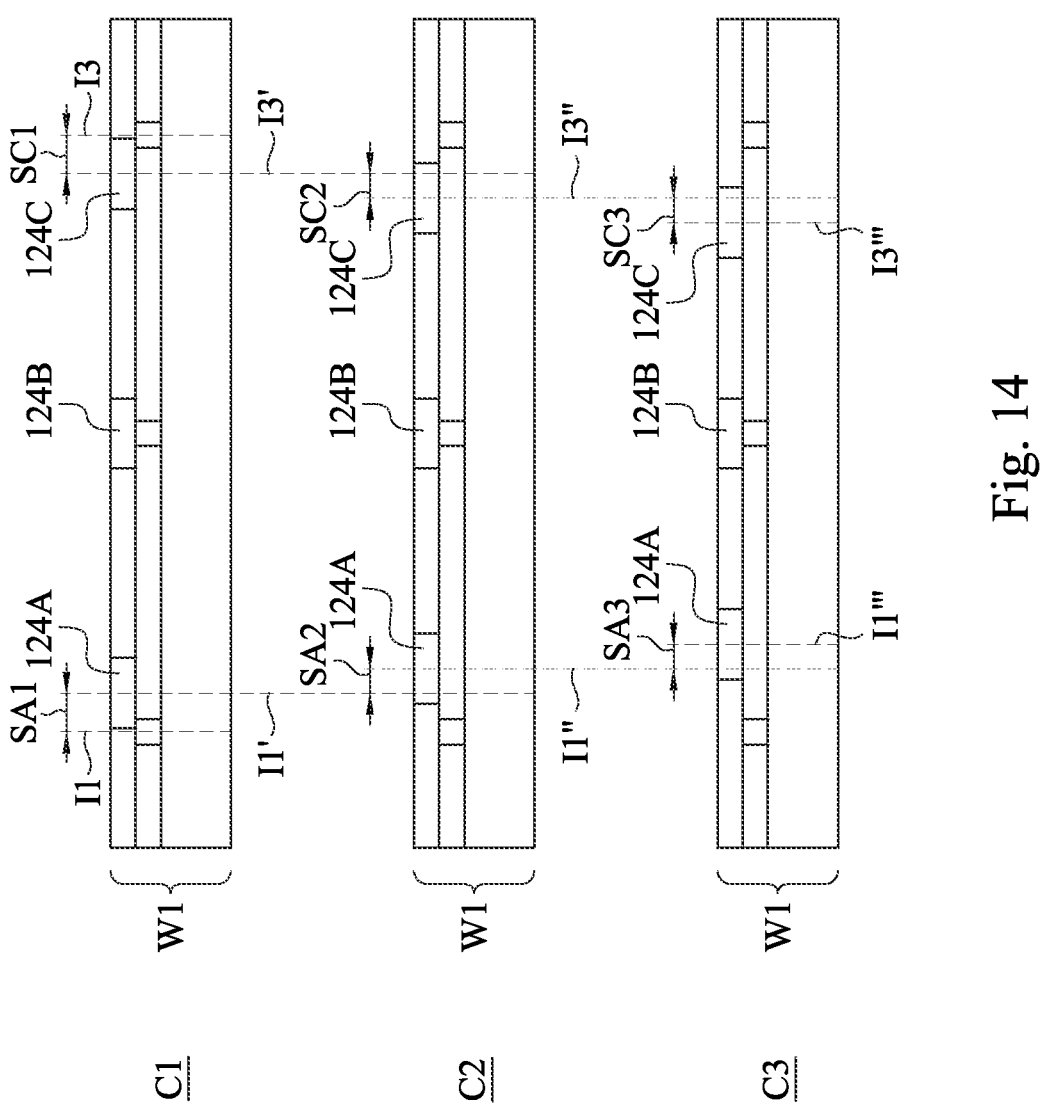
FIG. 14 is a schematic view of a compensation method in accordance with some embodiments of the present disclosure.
Figure 15:
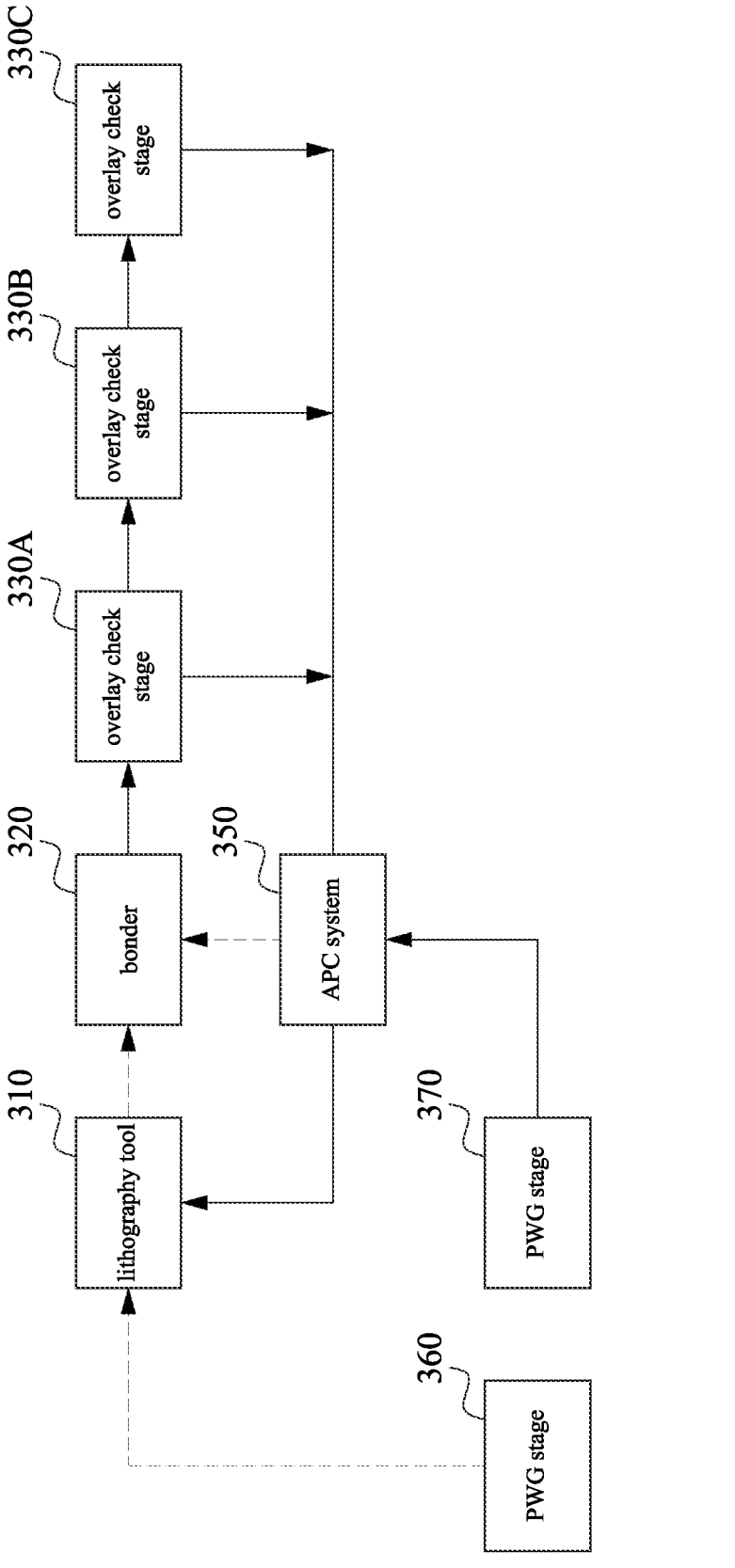
FIG. 15 is a block diagram of a compensation method in accordance with some embodiments of the present disclosure.

FIG. 13 is a flow chart of a compensation method in accordance with some embodiments of the present disclosure. FIG. 14 is a schematic view of a compensation method in accordance with some embodiments of the present disclosure. FIG. 15 is a block diagram of a compensation method in accordance with some embodiments of the present disclosure. It is noted that, the first compensation method and the second compensation method of FIG. 13 merely indicate that they are compensation methods at different stages, and would not limit the order thereof. Similarly, the first overlay check and the second overlay check of FIG. 13 merely indicate that they are overlay checks at different stages, and would not limit the order thereof.

The method M2 of FIG. 13 includes step S201 by forming semiconductor devices over wafers. The method M2 includes step S202 by forming bonding layers over the wafers. The method M2 includes step S203 by performing a temporary bonding. The method M2 includes step S204 by performing a performing a first overlay check performing a first overlay check, and determining whether a result of the first overlay check is within a predetermined specification. The method M2 includes step S205 by performing a first process. The method M2 includes step S206 by performing a second process. The method M2 includes step S207 by performing a first compensation method. The method M2 includes step S208 by performing a second overlay check, and determining whether a result of the second overlay check is within a predetermined specification. The steps S201 to S208 are similar to the steps S101 to S108 as discussed in FIG. 11, and thus relevant details will not be repeated.

The method M2 of FIG. 13 is different from the method M1 of FIG. 11, in that if the result of the first overlay check is determined as beyond the predetermined specification, the method then proceeds to step S209 by calculating first shifts. Referring to FIG. 14, FIG. 14 includes stages C1, C2, and C3, in which stage C1 is a schematic view of the wafer W1 after performing the temporary bonding (step S203). In some embodiments, the first shifts are calculated when the wafer W1 is at stage C1. For example, in FIG. 14, the position I1' of the conductive pad 124A has a first shift SA1 from an ideal position I1, and the position I3' of the conductive pad 124C has a first shift SC1 from an ideal position I3.

In FIG. 15, the wafers W1 and W2 that are bonded through the bonder 320 can be transferred to the overlay check stage 330A for conducting the first overlay check. In some embodiments, the overlay check stage 330A may include using suitable method to detect the bonding condition between wafers W1 and W2, in which the overlay check stage 330A can be used to calculate the first shifts SA1 and SC1 of FIG. 14.

Referring back to FIG. 13, the method then proceeds to step S210 by performing a first process. In some embodiments, the first process may be the first process P1 as discussed in FIGS. 4A and 4B, such as an annealing process.

After the step S210, the method then proceeds to step S211 by calculating second shifts. Referring to FIG. 14, the stage C2 is a schematic view of the wafer W1 after performing the first process (step S210). In some embodiments, the second shifts are calculated when the wafer W1 is at stage C2. For example, in FIG. 14, the position I1" of the conductive pad 124A at stage C2 has a second shift SA2 from the position I1' of the conductive pad 124A at stage C1, and the position I3" of the conductive pad 124C at stage C2 has a second shift SC2 from the position I3' of the conductive pad 124C at stage C1.

In FIG. 15, the wafers W1 and W2 can be transferred to the overlay check stage 330B for conducting an overlay check. In some embodiments, the overlay check stage 330B may include using suitable method to detect the bonding condition between wafers W1 and W2, in which the overlay check stage 330B can be used to calculate the second shifts SA2 and SC2 of FIG. 14.

After the step S211, the method proceeds to step S212 by performing a second process. In some embodiments, the second process may be the second process P2 as discussed in FIGS. 5A and 5B, such as a grinding process.

After the step S212, the method then proceeds to step S213 by calculating third shifts. Referring to FIG. 14, the stage C3 is a schematic view of the wafer W1 after performing the grinding process (step S212). In some embodiments, the third shifts are calculated when the wafer W1 is at stage C3. For example, in FIG. 14, the position I1'" of the conductive pad 124A at stage C3 has a third shift SA3 from the position I1" of the conductive pad 124A at stage C2, and the position I3'" of the conductive pad 124C at stage C3 has a third shift SC3 from the position I3" of the conductive pad 124C at stage C2.

In FIG. 15, the wafers W1 and W2 can be transferred to the overlay check stage 330C for conducting an overlay check. In some embodiments, the overlay check stage 330C may include using suitable method to detect the bonding condition between wafers W1 and W2, in which the overlay check stage 330C can be used to calculate the second shifts SA3 and SC3 of FIG. 14.

Referring back to FIG. 13, the method proceeds to step S214 by performing a second compensation method. In some embodiments, the second compensation method includes designing compensated wafers W1' and W2', such that the compensated wafers W1' and W2' include better bonding result. For example, the second compensation method may include modifying the positions of the conductive pads 124A to 124C and the positions of the conductive pads 224A to 224C of FIG. 10A.

In greater detail, referring to FIG. 14, the second compensation method is performed based on the first shifts of step S209, the second shifts of step S211, and the third shifts of step S213. For example, the position of the conductive pad 124A' of the compensated wafer W1' is determined by the first shift SA1, the second shift SA2, and the third shift SA3. In some embodiments, the conductive pad 124A' can be formed by shifting the conductive pad 124A of wafer W1 at stage C3, in which the shift amount may be a sum of the first shift SA1, the second shift SA2, and the third shift SA3 (e.g., SA1+SA2+SA3). In other words, the difference between the position of the conductive pad 124A of wafer W1 at stage C3 and the position of the conductive pad 124A' of wafer W1' is substantially equal to SA1+SA2+SA3.

Similarly, the position of the conductive pad 124C' of the compensated wafer W1' is determined by the first shift SC1, the second shift SC2, and the third shift SC3. In some embodiments, the conductive pad 124C' can be formed by shifting the conductive pad 124C of wafer W1 at stage C3, in which the shift amount may be a sum of the first shift SC1, the second shift SC2, and the third shift SC3 (e.g., SC1+SC2+SC3). In other words, the difference between the position of the conductive pad 124C of wafer W1 at stage C3 and the position of the conductive pad 124C' of wafer W1' is substantially equal to SC1+SC2+SC3.

In some embodiments of the present disclosure, because performing a first process (e.g., an annealing process) or a second process (e.g., a grinding process) may also cause warpage to the wafers W1 and W2, and will further change the positions of the conductive pads. Accordingly, in the compensation method, shifts at different stages are taken into account, such that the compensated wafers have better bonding quality. It is noted that FIG. 14 takes the wafer W1 as an example, while in the present disclosure, the above second compensation method can also be performed to the wafer W2, and thus relevant details will not be repeated. In some embodiments, the steps S212 and S213 may be omitted. That is, the third shifts (e.g., the third shifts SA3 and SC3) are not used in the second compensation method of step S214.

Referring back to FIG. 13, the method proceeds to step S215 by manufacturing wafers based on the second compensation method. In some embodiments, the lithography tool 310 of FIG. 15 can be used to manufacture the wafers W1' and W2'. In some embodiments, the wafers W1' and W2' may be manufactured based on the above mentioned first shifts, the second shifts, and the third shifts.

As discussed in FIG. 9, during the first exposure step for forming the conductive pad 124A', the exposure of the exposure field A1 can be shifted by SA1+SA2+SA3 to define the position of the conductive pad 124A'. During the third exposure step for forming the conductive pad 124C', the exposure of the exposure field A3 can be shifted by SC1+SC2+SC3 to define the position of the conductive pad 124C'. In some embodiments where the steps S212 and S213 are omitted, during the first exposure step for forming the conductive pad 124A', the exposure of the exposure field A1 can be shifted by SA1+SA2 to define the position of the conductive pad 124A'. During the third exposure step for forming the conductive pad 124C', the exposure of the exposure field A3 can be shifted by SC1+SC2 to define the position of the conductive pad 124C'.

After the step S215, the step S203 is performed. Here, a temporary bonding process may be performed to the compensated wafers W1' and W2'. Then, the method can proceed to step S204 (and the following steps) to complete the bonding between the wafers W1' and W2'.

Referring to FIG. 15, the results generated from the overlay check stages 330A, 330B, and 330C can be transferred to the APC system 350. Moreover, FIG. 15 also includes PWG stages 360 and 370.

In some embodiments, the PWG stage 360 may be used to measure the shapes of the wafers W1 and W2 (or the wafers W1' and W2') prior to performing the step S202. In greater detail, prior to forming the bonding layers 120 and 220, the shapes of the wafers W1 and W2 (or the wafers W1' and W2') are measured. On the other hand, the PWG stage 370 may be used to measure the shapes of the wafers W1 and W2 (or the wafers W1' and W2') after performing the step S202. In greater detail, after forming the bonding layers 120 and 220, the shapes of the wafers W1 and W2 (or the wafers W1' and W2') are measured.

For example, each time when performing the method M2, several wafer shape data of the wafers W1 and W2 (or the wafers W1' and W2') can be recorded using the PWG stage 360. In some embodiments, the lithography tool 310 can initially modify the positions of the conductive pads of the wafers W1 and W2 based on the data collected from the PWG stage 360. On the other hand, each time when performing the method M2, several wafer shape data of the wafers W1 and W2 (or the wafers W1' and W2') can be recorded using the PWG stage 370. Then, the APC system 350 may collect the data from the PWG stage 370 and the overlay check stages 330A, 330b, and 330C. The lithography tool 310 and the bonder 320 can adjusting the first compensation method and the second compensation method based on the collected data, so as to obtain a better bonding quality.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A compensation method for wafer bonding, comprising:

bonding a first wafer and a second wafer, wherein the first wafer has a first conductive pad, and the second wafer has a second conductive pad;

performing a first process to the first wafer and the second wafer, wherein prior to performing the first process, the first conductive pad has a first position, and a first shift is between the first position and an ideal position, and wherein after performing the first process, the first conductive pad has a second position, and a second shift is between the second position and the first position, wherein the ideal position is a position of the first conductive pad under a condition where the first wafer is not distorted during manufacturing process;

performing a second process to the second wafer, wherein after performing the second process, the first conductive pad has a third position, and a third shift is between the third position and the second position;

performing a first compensation method to produce a compensated first wafer and a compensated second wafer, the first compensation method comprising defining a position of a first conductive pad of the compensated first wafer, wherein the position of a first conductive pad of the compensated first wafer is determined by the first shift, the second shift, and the third shift; and bonding the compensated first wafer and the compensated second wafer.

2. The method of claim 1, wherein a difference between the position of the first conductive pad of the compensated first wafer and the third position of the first conductive pad of the first wafer is equal to a sum of the first shift, the second shift, and the third shift.

3. The method of claim 1, further comprising, prior to performing the first process, performing a second compensation method, the second compensation method comprising:

separating the first wafer and the second wafer;

adjusting relative positions of the first wafer and the second wafer; and re-bonding the first wafer and the second wafer;

performing an overlay check, the overlay check comprising determining whether the first conductive pad of the first wafer is in contact with the second conductive pad of the second wafer; and determining whether a result of the overlay check is within a predetermined specification.

4. The method of claim 3, wherein the first compensation method is performed by a lithography tool, and the second compensation method is performed by a bonder.

5. The method of claim 2, wherein adjusting relative positions of the first wafer and the second wafer comprises:

linearly moving the first wafer with respect to the second wafer;

rotating the first wafer with respect to the second wafer; or scaling up the first wafer with respect to the second wafer.

6. The method of claim 1, further comprising:

measuring a wafer shape of the first wafer; and forming the first conductive pad over the first wafer based on the wafer shape.

* * * * *